(12) United States Patent
Nishikawa et al.

(10) Patent No.: US 7,903,055 B2
(45) Date of Patent: Mar. 8, 2011

(54) LIGHT-EMITTING DISPLAY

(75) Inventors: Ryuji Nishikawa, Moriguchi (JP); Tetsuji Omura, Moriguchi (JP)

(73) Assignee: Sanyo Electric Co., Ltd. (JP)

( * ) Notice: Subject to any disclaimer, the term of this patent is extended or adjusted under 35 U.S.C. 154(b) by 815 days.

(21) Appl. No.: 11/579,215

(22) PCT Filed: Apr. 27, 2005

(86) PCT No.: PCT/JP2005/008064
§ 371 (c)(1),
(2), (4) Date: Aug. 13, 2007

(87) PCT Pub. No.: WO2005/107327
PCT Pub. Date: Nov. 10, 2005

(65) Prior Publication Data
US 2008/0024402 A1 Jan. 31, 2008

(30) Foreign Application Priority Data
Apr. 30, 2004 (JP) ................. 2004-135968

(51) Int. Cl.
*G09G 3/30* (2006.01)
(52) U.S. Cl. ................. 345/77; 345/80; 345/82; 345/84; 345/690; 257/40; 257/98; 313/503; 313/509; 315/169.1; 315/169.3; 315/200 R; 438/29; 438/31; 438/32
(58) Field of Classification Search .............. 345/76, 345/77, 80–84, 690; 257/40, 98; 313/503–506, 313/509; 315/169.1, 169.3, 200 R; 438/29, 438/31, 32
See application file for complete search history.

(56) References Cited

U.S. PATENT DOCUMENTS

| 5,814,416 | A | 9/1998 | Dodabalapur et al. |
| 6,433,487 | B1 * | 8/2002 | Yamazaki ................. 315/169.3 |
| 6,501,098 | B2 | 12/2002 | Yamazaki |
| 6,628,086 | B2 | 9/2003 | Hayashi et al. |

(Continued)

FOREIGN PATENT DOCUMENTS
JP     9-190883     7/1997
(Continued)

OTHER PUBLICATIONS

Notification of Transmittal of Translation of the International Preliminary Report on Patentability and Written Opinion of the International Searching Authority for International Application No. PCT/JP2005/008064 mailed Nov. 23, 2006.

(Continued)

*Primary Examiner* — Henry N Tran
(74) *Attorney, Agent, or Firm* — Cantor Colburn LLP

(57) ABSTRACT

Disclosed is a light-emitting display having a plurality of pixels wherein each pixel comprises a light-emitting device (100) having a light-emitting element layer which is formed between a first electrode and a second electrode and contains at least a light-emitting layer. An insulating layer (30) is formed between the light-emitting device (100) and a surface of a first or second substrate on the viewing side of the display, and the insulating layer (30) is provided with recesses and projections in at least one or more pixel regions, thereby forming an optical path length adjusting portion (32). By forming such an optical path length adjusting portion (32) in a pixel region, there is an increase in the interference conditions for the light emitted from the light-emitting device (100) to the outside, thereby averaging the interference.

19 Claims, 14 Drawing Sheets

U.S. PATENT DOCUMENTS

| | | |
|---|---|---|
| 6,670,772 B1 * | 12/2003 | Arnold et al. ............ 315/169.3 |
| 6,757,037 B2 | 6/2004 | Matsuo et al. |
| 6,787,796 B2 * | 9/2004 | Do et al. ......................... 257/40 |
| 7,355,339 B2 * | 4/2008 | Okinaka et al. ............... 313/504 |
| 2004/0017153 A1 | 1/2004 | Nishikawa |

FOREIGN PATENT DOCUMENTS

| | | |
|---|---|---|
| JP | 2000-40584 | 2/2000 |
| JP | 2000-223716 | 8/2000 |
| JP | 2000-284705 | 10/2000 |
| JP | 3260655 | 12/2001 |
| JP | 2002-8870 | 1/2002 |
| JP | 2002-252088 | 9/2002 |
| JP | 2003-43953 | 2/2003 |
| JP | 2003-133062 | 5/2003 |
| JP | 2003-257620 | 9/2003 |
| JP | 2003-257662 | 9/2003 |
| JP | 2004-31350 | 1/2004 |

OTHER PUBLICATIONS

International Search Report for Application No. PCT/JP2005/008064 mailed Sep. 6, 2005.

* cited by examiner

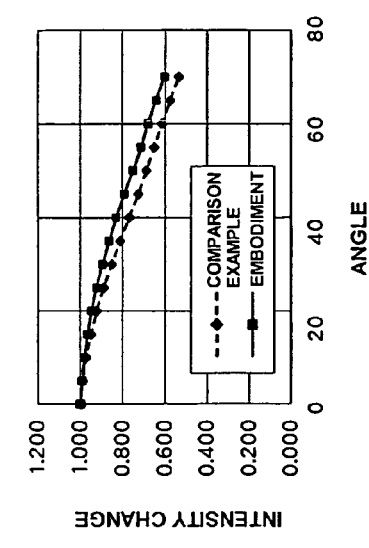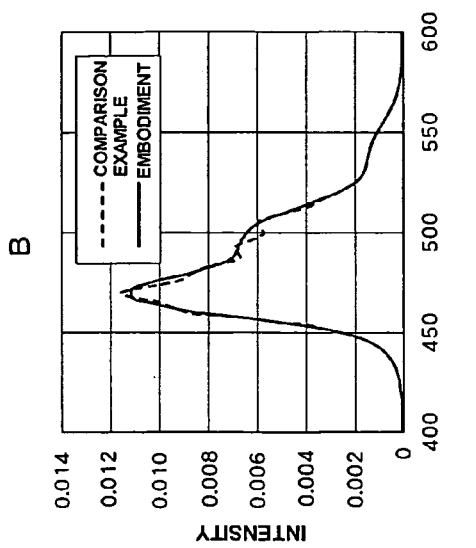
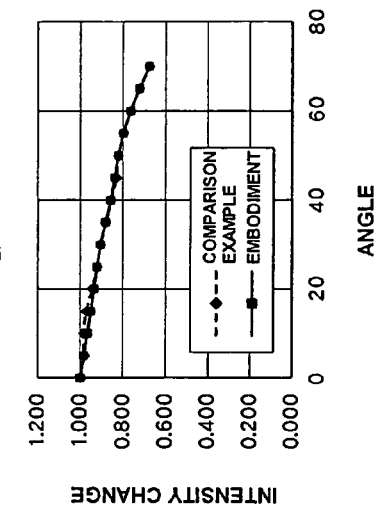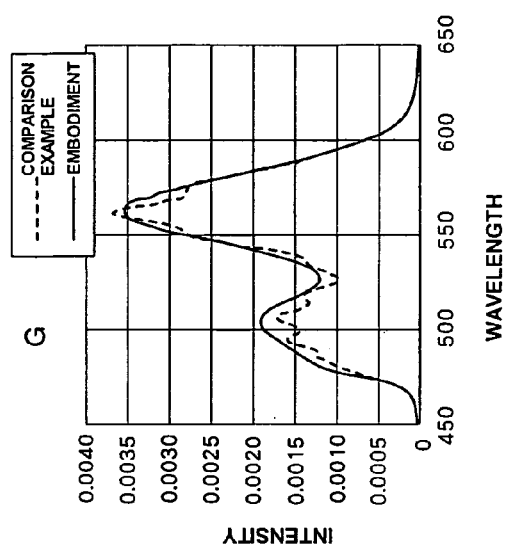
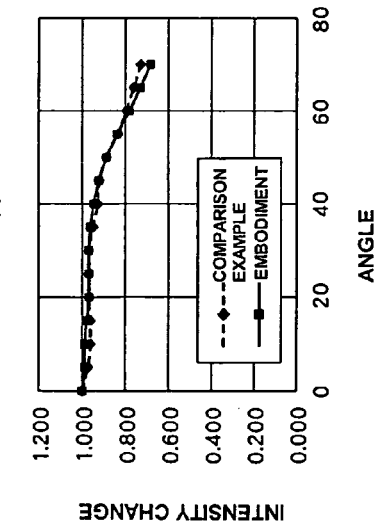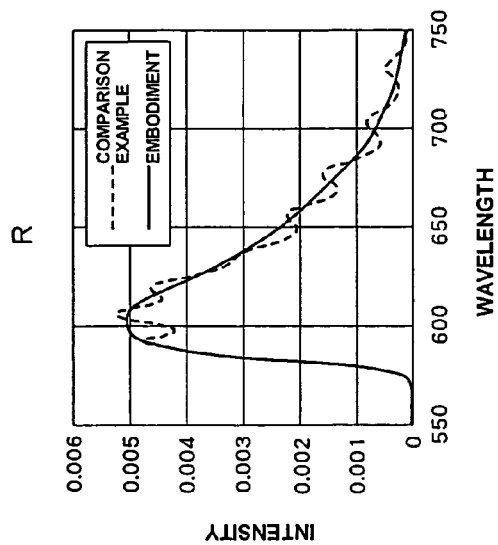
Fig. 8(a) Fig. 8(b) Fig. 8(c)
Fig. 8(d) Fig. 8(e) Fig. 8(f)

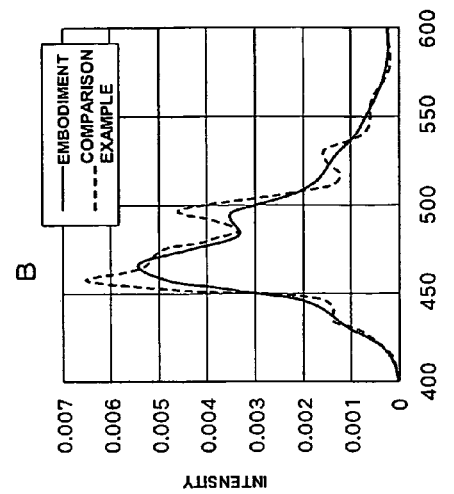
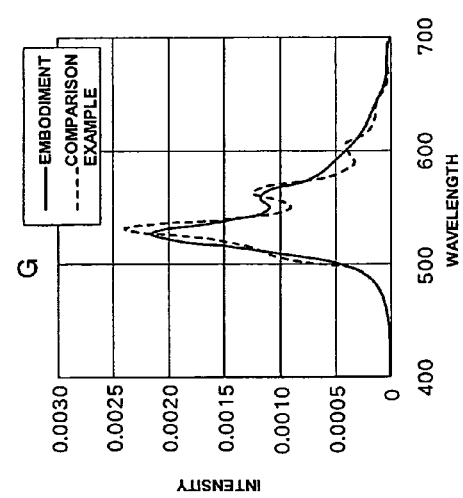
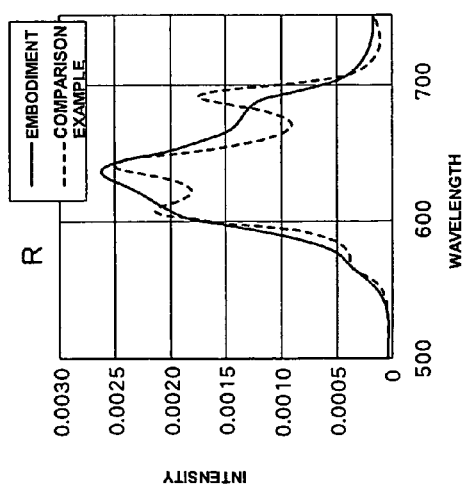
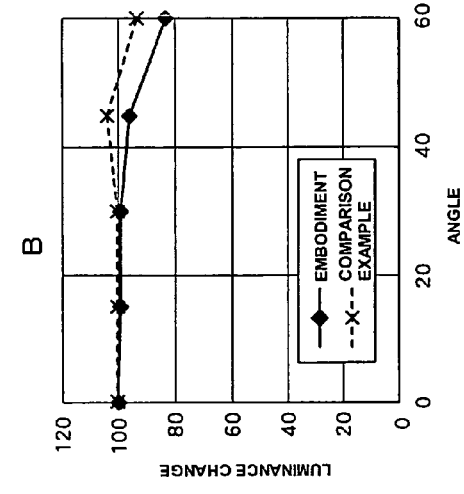
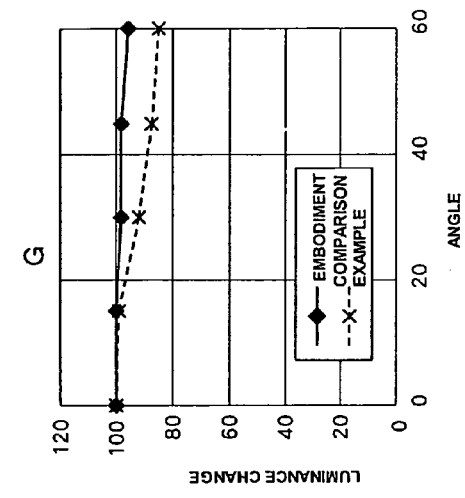
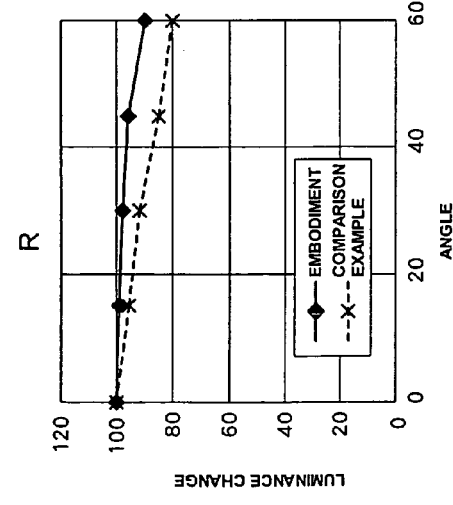

LIGHT-EMITTING DISPLAY

CROSS-REFERENCE

This is a U.S. national stage application of International Application No. PCT/JP2005/8064, filed on 27 Apr. 2005. Priority under 35 U.S.C. §119(a) and 35 U.S.C. §365(b) is claimed from Japanese Application No. JP2004-135968, filed 30 Apr. 2004, the disclosure of which is also incorporated herein by reference.

TECHNICAL FIELD

The present invention relates to a light emitting display, and more particularly to a display including an emitting element for each pixel.

BACKGROUND ART

Flat panel displays (FPD) that can be manufactured in reduced size and thickness have been attracting attentions in recent years, and especially a liquid crystal display device, a typical type of the FPDs, has already been employed in a variety of equipments. At present, emissive devices (displays and light sources) using a self-emissive electroluminescence (hereinafter referred to as "EL") element, particularly organic EL displays capable of emitting light at a high luminance in various colors depending on the organic compound material used, have been actively researched and developed.

In contrast to liquid crystal display devices in which the transmission rate of light from a back light is controlled by a liquid crystal panel disposed on a front surface thereof as a light valve, such organic EL display devices are self-emissive as described above, and therefore are bright and have excellent viewing angle characteristics in principle, achieving high-quality display.

Further, self-emissive elements, such as the above-described organic EL elements, can emit light with any wavelength of R (red), G (green), B (Blue), or the like with high color purity, and can be implemented in a very thin layer, so that such elements are highly advantageous in terms of reduction in thickness of the displays and the like.

The emitting element, however, includes a stacked layer structure composed of a multitude of functional thin layers, and different materials are used depending on the function of each layer, resulting in different refractive indices in different layers and tending to generate reflection at an interface between layers. As a result, light directly emitting from an emitting layer has a different phase from light reflected midway before emission, causing interference on the observation surface side, thereby easily generating variation in luminance and shift in white balance. Such interference increases color dependency of the viewing angle, i.e. color is varied from one observing direction to another, thereby lowering display quality as a display device.

DISCLOSURE OF INVENTION

The present invention aims to reduce the above-described variation in color and luminance in light emitting displays.

The present invention according to one aspect provides a light emitting display comprising a plurality of pixels, each having an emitting element in which an emitting element layer including at least an emitting layer between a first electrode and a second electrode is formed, the emitting element being formed above a first substrate, and the light from the emitting element being emitted outside, wherein an insulating layer is formed between the emitting element and a surface of the display on an observation side, convexity/concavity is formed in one or more pixel regions in the insulating layer, and an optical path length adjusting section is formed for adjusting an optical path length from the emitting layer to the surface of the display on the observation side, a concave or convex portion of the convexity/concavity has a diameter of approximately 10 μm, and a plurality of optical path lengths from the emitting layer to the surface of the display on the observation side are formed in one pixel region by the optical path length adjusting section, and a plurality of interference generating conditions are set in one pixel region.

The present invention according to another aspect provides a light emitting display comprising a plurality of pixels for emitting light from an emitting element to outside, wherein each pixel includes the emitting element in which an emitting element layer including at least an emitting layer between first and second electrodes is formed, and a circuit element formed between layers of the emitting element and a first substrate and including one or more switch elements for controlling the emitting element for each pixel, an insulating layer is formed between layers of the circuit element and the emitting element connected to a corresponding one of the switch elements, in the insulating layer, in one or more pixel regions, convexity/concavity is selectively formed only in an emissive region of the pixel region, and an optical path length adjusting section is formed for adjusting an optical path length from the emitting layer to a surface of the display on an observation side, and a plurality of optical path lengths are formed in one pixel region from the emitting layer to the surface of the display on the observation side by the optical path length adjusting section, so that a plurality of interference generating conditions are set in one pixel region.

Thus, convexity/concavity is provided in the insulating layer to form the optical path length adjusting section, so that a plurality of optical path lengths can be obtained from the emitting layer to the surface of the substrate on the observation side of the display in one pixel region. Only one optical path length from the emitting layer to the surface of the substrate on the element side in one pixel region leads to only one kind of interference generating condition in the pixel region caused by the optical path length and a predetermined wavelength of emitted light determined by the emissive material used, thereby possibly generating strong interference. As a result, it is more likely to generate variation in color and luminance due to variation in film thickness or the like. By providing a portion having a different optical path length in a pixel, however, the conditions of generating interference are increased, and as a result of combined conditions, the degree of generating interference can be averaged in one pixel, thereby suppressing variation in color and luminance and also color change related to the viewing angle because of the averaged interference.

According to a further aspect of the present invention, in the light emitting display, a wavelength adjusting layer for obtaining an associated color is formed at least in some pixels of the plurality of the pixels between layers of the emitting element and the first substrate or between the emitting element and the second substrate, the emitting layer emits light of the same wavelength in any of the plurality of pixels, and light from the emitting element is adjusted to have a predetermined wavelength by the wavelength adjusting layer, and emitted outside through the first substrate or the second substrate.

According to a further aspect of the present invention, in the light emitting display, the emitting layer emits light of an associated color in the plurality of pixels, and of the light emitted by the emitting element to outside through the first substrate or the second substrate in one pixel region, the light transmitting through the optical path length adjusting section has the optical path length which differs from that of the light that does not transmit through the optical path length adjusting section.

According to a further aspect of the present invention, two or more concave or convex portions formed in the insulating layer are formed juxtaposed in a direction of a shorter side of the one pixel region, and a difference in height in the convexity/concavity is greater than 0 μm, and equal to or smaller than 3.0 μm.

According to a further aspect of the present invention, the difference in height in the convexity/concavity is the same in all pixel regions of the plurality of pixels. Consequently, a process for forming the optical path length adjusting section can be performed simultaneously under the same conditions for all pixels, thereby improving efficiency in manufacturing process.

According to a further aspect of the present invention, the difference in height in the convexity/concavity may be varied in each pixel region of the plurality of pixels in accordance with an associated color. This enables a highly accurate adjustment in accordance with color, i.e. the wavelength of emitted light, thereby further improving display quality.

According to the present invention, a plurality of interference generating conditions can be set in one pixel to average interference for each pixel, thereby reducing variation in color due to variation in film thickness and color change due to the viewing angle in a very easy and reliable manner.

BRIEF DESCRIPTION OF THE DRAWINGS

FIGS. 8(a), 8(b), 8(c), 8(d), 8(e) and 8(f) are views for describing optical properties of a white light emissive organic EL display device according to the embodiment of the present invention.

FIGS. 9(a), 9(b), 9(c), 9(d), 9(e) and 9(f) are views for describing optical properties of the organic EL display using a color separate provision method according to the embodiment of the present invention.

BEST MODE FOR CARRYING OUT THE INVENTION

Best modes of the present invention (hereinafter referred to as embodiments) will now be described with reference to the accompanying drawings.

Figure 1:
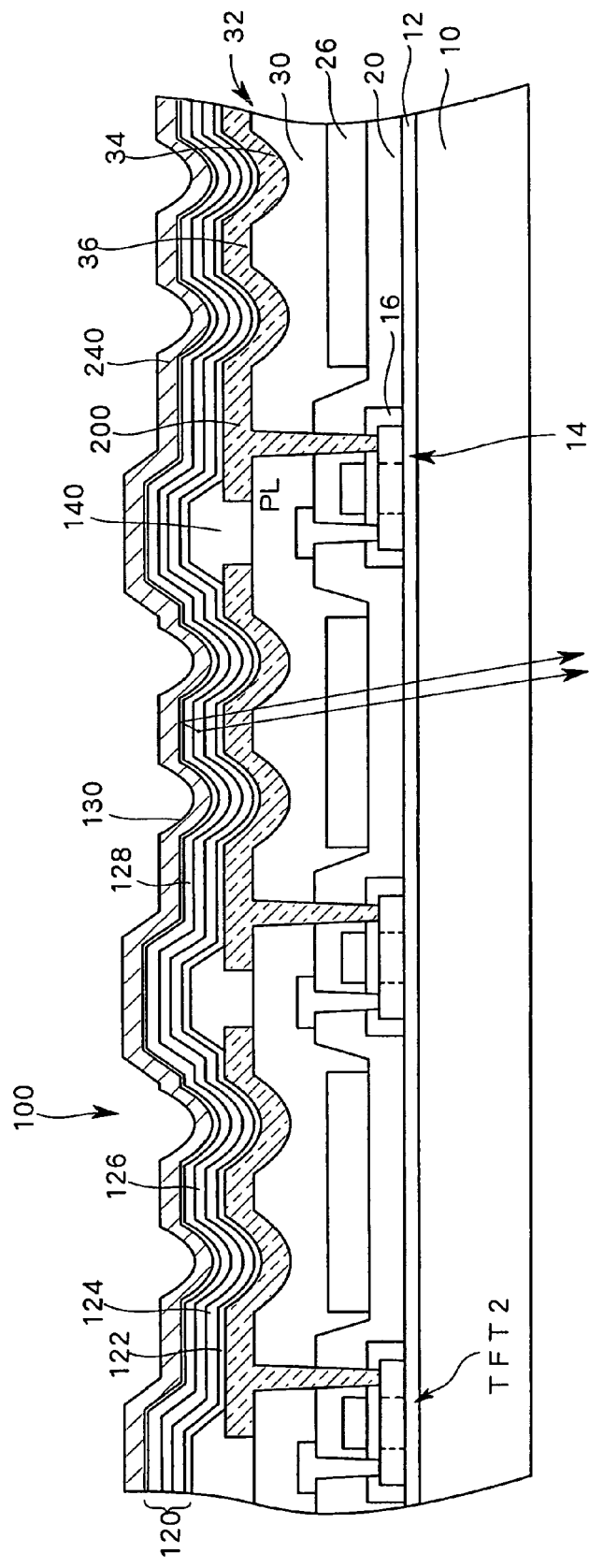
FIG. 1 schematically shows a cross sectional structure of an organic EL display device having an optical path length adjusting section according to an embodiment of the present embodiment.
Figure 2:
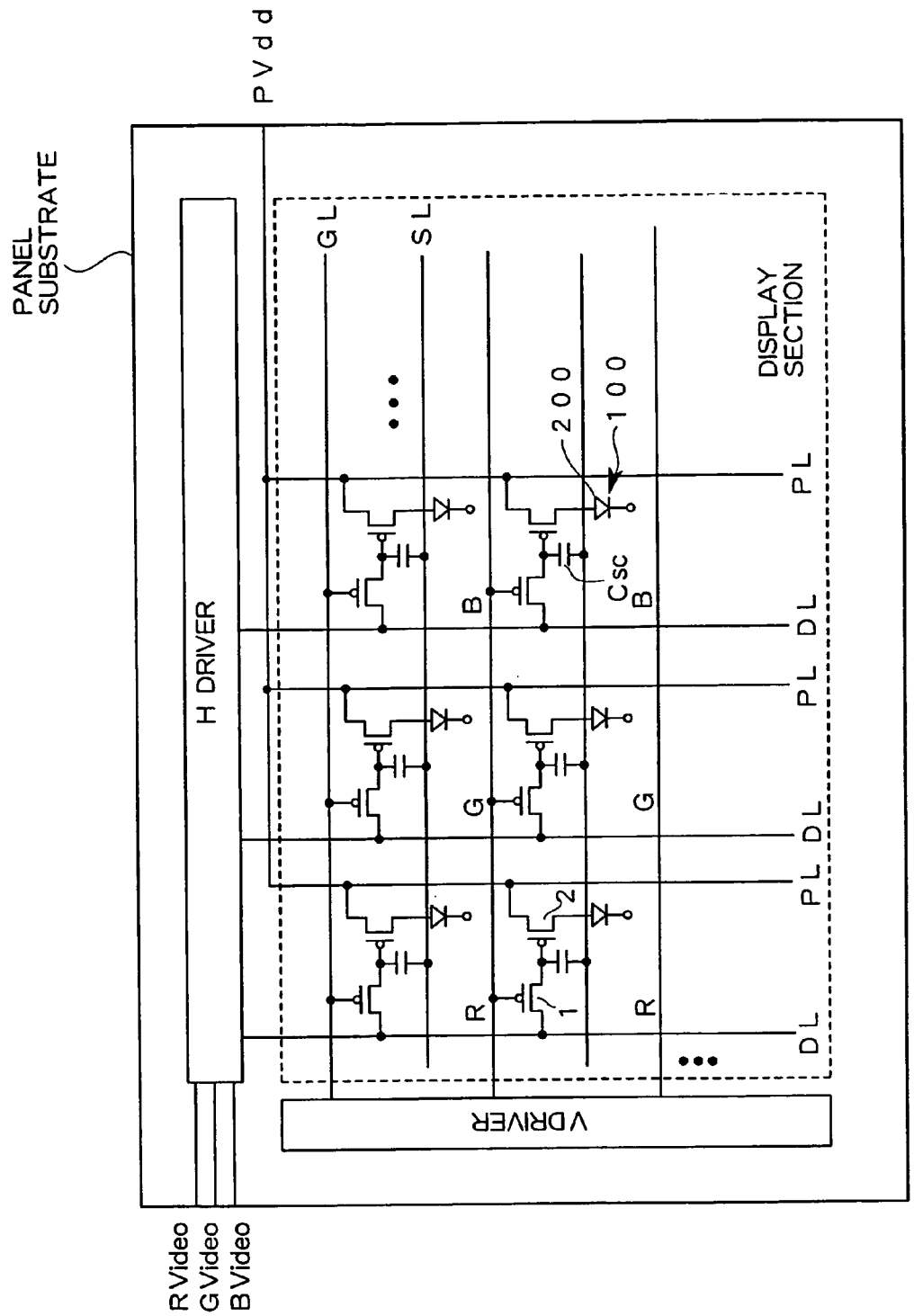
FIG. 2 schematically shows a circuit of an active matrix organic EL display device according to the embodiment of the present invention.

FIG. 1 schematically shows a cross sectional structure of an important part of a light emitting display device according to an embodiment of the present invention. FIG. 2 shows, as such a light emitting display device, an example of an equivalent circuit of an active matrix type display device having a thin film transistor (TFT) as a switch element controlling an emitting element for each pixel. As a light emitting display device, an organic EL display device using an organic EL element as an emitting element will be described hereinafter as an example.

In an active matrix type organic EL display device, a plurality of pixels are arranged in a matrix on a transparent substrate 10 formed of glass or the like, and each pixel includes, as illustrated in FIG. 2, an organic EL element 100, a first thin film transistor (hereinafter referred to as "TFT1") and a second thin film transistor (hereinafter referred to as "TFT2") for controlling light emission at the organic EL element 100, and a storage capacitor $C_{SC}$ for storing data in accordance with the displayed contents for a predetermined period.

In a horizontal scanning direction of each pixel, a plurality of gate lines (selection lines) GL extending in the horizontal scanning direction and sequentially receiving a selection signal, and a plurality of capacitor lines SL for causing one electrode of the storage capacitor $C_{SC}$ to have a predetermined potential are formed. In a vertical scanning direction, a plurality of data lines extending in the vertical scanning direction and receiving a data signal, and a plurality of power source lines PL connected to a common power source Pvdd and supplying electric power (electric current) to each pixel are formed.

When a low temperature polycrystalline silicon layer formed through laser annealing is used as an active layer of each TFT, a horizontal driver (H driver) and a vertical driver (V driver) formed by TFTs having the low temperature polycrystalline silicon layer formed through the same steps as the TFTs in the pixel section can be disposed in a peripheral area of a display section where a plurality of pixels are arranged on the same substrate, as illustrated in FIG. 2.

A gate of the TFT1 is connected to the gate line GL, and a first conductive region (such as a source in the example of FIG. 2) is connected to the data line DL, while a gate of the TFT2 is connected to a second conductive region (a drain in this example) of the TFT1 and the other electrode of the storage capacitor $C_{SC}$. A first conductive region (a source in this example) of the TFT2 is connected to the power source line PL, and a second conductive region (a drain in this example) thereof is connected to an anode of the organic EL element 100. When the selection signal is supplied to the corresponding gate line GL to turn on the TFT1, a voltage in accordance with the data signal supplied to the corresponding data line DL through the TFT1 is applied to the gate of the TFT2, and the corresponding electrical charges are charged in the storage capacitor $C_{SC}$, thereby maintaining the gate voltage of the TFT2 for a predetermined period. The TFT2 supplies electric current from the power source line PL in accordance with the voltage applied to the gate thereof, and the current is supplied to the organic EL element 100, which emits light at the luminance in accordance with the supplied current.

As shown in FIG. 1, the organic EL element 100 has a multi-layered structure including an emitting element layer 120 having at least an emitting layer including an organic emissive material between a first electrode 200 and a second electrode 240. The organic EL element 100 is formed on the transparent glass substrate 10. More specifically, prior to formation of the organic EL element 100, the above-described pixel circuit elements, such as TFT1 and TFT2 and the storage capacitor $C_{SC}$, wiring lines, and the like (and also a circuit for a driver if it is provided therein) are first formed (this layer will be hereinafter referred to as a "TFT layer") on the glass substrate 10 for controlling the organic EL element 100 for each pixel. Covering the TFT layer, a planarization insulating layer 30 is formed of, for example, an acrylic resin, polyimide, or the like, and the first electrode 200 of the organic EL element 100 is formed on the planarization insulating layer 30.

For an active matrix type display, the first electrode 200 can be formed as an individual pattern for each pixel, while the second electrode 240 formed opposite to the first electrode 200 sandwiching the emitting element layer 120 can be formed as a pattern common to all pixels, as illustrated in FIG. 1.

The organic EL element 100 emits light in accordance with the electric current supplied from the power source line PL through the TFT2, as described above. More specifically, holes are injected from the anode (the first electrode in this example) 200 and the electrons are injected from the cathode (the second electrode in this example) 240 to the emitting element layer 120, so that the injected holes and electrons recombine in the emitting element layer 120, especially the emitting layer, thereby exciting the organic emissive material with the resulting recombination energy, and causing light emission when it returns to the ground state. Such a light emission principle is utilized.

For the first electrode 200, indium tin oxide (ITO), which is a conductive metal oxide material having a high work function and allowing easy injection of holes, is used, while metals having a small work function and allowing easy injection of electrons, such as Al and an alloy thereof, are used for the second electrode 240. The planarization insulating layer 30 and the insulating layer for pixel circuit elements formed as layers underlying the organic EL element 100, and the glass substrate 10, are each formed of a material allowing transmission of light generated in an emitting layer 126 of the organic EL element 100.

The organic emitting element layer 120 at least includes an emitting layer having organic emissive molecules, and is formed as a single-, double-, triple-, or multi-layered structure having four or more layers, depending on the materials used. In the example of FIG. 1, a hole injection layer 122, a hole transport layer 124, the emitting layer 126, an electron transport layer 128, and an electron injection layer 130 are formed stacked in the above-mentioned order from the side of the first electrode 200 functioning as an anode through, for example, successive film formation using a vacuum vapor deposition method. On the electron injection layer 130, the second electrode 240 functioning as a cathode in this example is formed continuously after the organic emitting element layer 120 through the vacuum vapor deposition method similar to the one used for the element layer 120.

According to the present embodiment, the organic EL elements 100 emitting the same color of light (such as white light) are used for all pixels, and a wavelength adjusting layer 26 for obtaining R (red), G (green), B (blue) light necessary for achieving full color display from the white light, for example, are formed in a corresponding pixel region between the planarization insulating layer 30 and the TFT layer. As the wavelength adjusting layer 26 for obtaining light having the R, G, B wavelength from white light, a so-called color filter transmitting only the light having a particular wavelength range out of the whole wavelength range of incident light can be used. When the color of emitted light is one of the three primary colors, such as blue, a color conversion layer formed of a fluorescent material excited by incident light (blue light) to emit light with a different wavelength (R, G) or the like may be used. Both the color filter and the color conversion layer may also be used for a single display in order to improve color purity.

Light obtained in the emitting layer 126 of the organic EL element 100 and advancing toward the first electrode 200 transmits through the first electrode 200, the planarization insulating layer 30 and TFT layer, and the glass substrate 10, and exits outside. Among the light beams obtained in the emitting layer 126, the light beam advancing toward the second electrode 240 is reflected once at a surface of the second electrode 240 of a metal material, such as Al, as described above, and advances toward the first electrode 200. Thereafter, the light beam transmits through the first electrode 200, the planarization insulating layer 30, the insulating layer for pixel circuit elements, and the glass substrate 10, and exits outside, similarly to the light described above.

In the above-described organic EL display device, according to the present embodiment, the optical path length from the emitting layer 126 to the surface of the substrate 10 on the element side is varied within one pixel region. This is equivalent to varying the distance to a light source (i.e. the emitting layer 126) in a single pixel region when viewed from the observation side of the display (the observation surface side of the substrate 10). In order to achieve different optical path lengths (vary the position of the light source) in a single pixel region, an optical path length adjusting section 32 is provided between the element 100 and the substrate 10 in the present embodiment. More specifically, below the organic EL element 100 described above, a concave portion 34 locally recessed from a flat surface is formed in this example as the optical path length adjusting section 32 in the planarization insulating layer 30 employed for rendering the surface where the element 100 is formed as flat as possible.

The organic EL element 100 currently formed is very thin, having a total thickness of 1 μm or less, and the emitting element layer 120 formed between the first and second electrodes 200 and 240 has a thickness of, for example, about as small as 250 nm to 300 nm. As a result, a defect occurring in the thin emitting element layer 120 makes a short circuit between the first and second electrodes 200 and 240. Further, when the pixel circuit elements and the like are formed under the element 100, the presence of such elements causes greater irregularity, i.e. convexity/concavity, in the surface where the element 100 is formed, which may cause poor coverage at a stepped portion of the irregular surface of the thin emitting element layer 120. Prevention of a short circuit being formed by the irregularity of the surface is ensured by formation of the elements on as flat a surface as possible (note that such prevention is ensured as long as the surface is smooth), and therefore the planarization insulating layer (smoothing insulating layer) 30 is formed of an acrylic resin or the like having excellent surface flatness (smoothness) quality under the element 100. In this planarization insulating layer 30, the concave portion 34 is formed as the optical path length adjusting section 32 in this embodiment. The emitting element layer 120 can be formed without defects as long as the surface has smoothness and need not be completely planarized, and therefore the concave portion 34 provided in the planarization insulating layer 30 is preferably formed without any sharp corners on the surface. Formation of the concave portion 34 in the planarization insulating layer 30 naturally produces a convex portion 36, in contrast to the concave portion 34, in a region where the concave portion 34 is not formed. Note that the concept of the convex and concave portions functioning as the optical path length adjusting section 32 in the present embodiment is to form a region for altering the optical path length with respect to other portions in a single pixel region. Therefore, forming the concave portions 34 discretely on the surface as described above, locally forming the convex portions 36 with respect to the concave portion 34 regarded as the base level in contrast to the above example, additionally forming the convex portion 36 with the flat surface as the base level, and forming both the convex and concave portions, are all equivalent.

As illustrated in FIG. 1, the optical path length adjusting section 32 is positioned over the region where the wavelength adjusting layer 26 is formed for any of the R, G, and B pixels. In order to assure reliability, the initial thickness of the planarization insulating layer 30 is preferably determined so that the planarization insulating layer 30 is not completely removed to expose the wavelength adjusting layer 26 in the region where the concave portion 34 is formed. Particularly, the so-called color filter material used as the wavelength adjusting layer 26 often has a rough surface, and exposure of such a rough surface of the color filter layer at the bottom of the concave portion 34 may affect coverage of the first electrode 200 of the organic EL element 100 formed on top thereof. As a result, in a display having the above-described wavelength adjusting layer 26 under the insulating layer 30 having convexity/concavity, preferably the concave portion 34 does not penetrate this insulating layer.

As described hereinafter, the region of the organic EL element 100 where the first and second electrodes 200 and 240 face each other sandwiching the emitting element layer 120 functions as an emissive region, and the concave portion 34 of the optical path length adjusting section 32 is formed in this emissive region. Although the portion may be formed outside the emissive region, it does not fulfill the function of adjusting the optical path length of the exiting light. In a region located between pixels, a second planarization insulating layer 140 is formed for purposes including that of maintaining flatness of the surface of the emitting element layer 120 to be formed thereon, and, if the surface of the optical path length adjusting section 32 has convexity/concavity in a non-emissive region, i.e. the region between pixels, the second planarization insulating layer 140 may not completely fill in the recess to remove the convexity/concavity. Consequently, the optical path length adjusting section 32 is formed only in the emissive region, not in the non-emissive region, in this embodiment.

In each layer of the organic EL element 100 formed on the planarization insulating layer 30, a convexity/concavity having the same thickness at least in one pixel region is formed in accordance with the concave and convex portions 34 and 36 of the planarization insulating layer 30.

Figure 3:
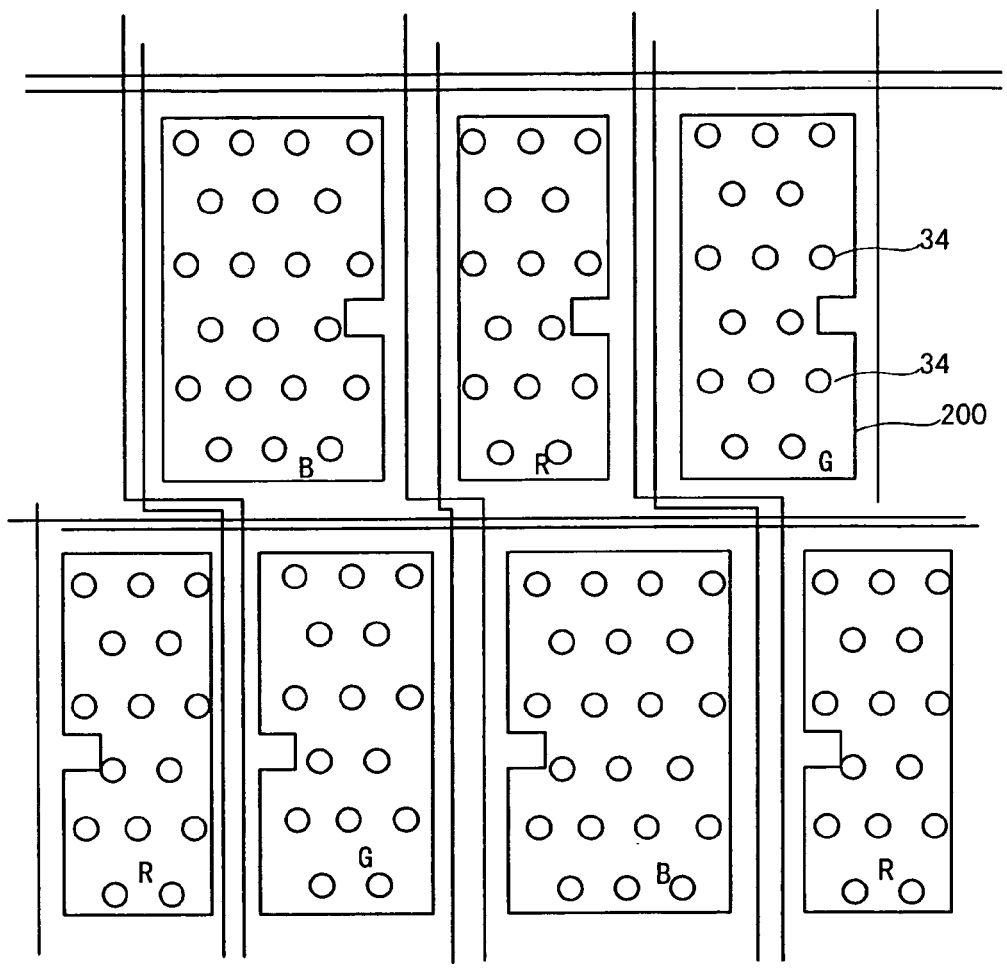
FIG. 3 is a schematic plan view of pixels showing an exemplary arrangement of the optical path length adjusting section of a planarization insulating layer according to the embodiment of the present invention.

The depth of the concave portion 34 (the difference in height at the convexity/concavity or the height of the convex portion) is greater than 0 μm, but equal to or smaller than 3.0 μm, preferably in the range of 0.5 μm or greater and approximately 2.0 μm or smaller. While forming at least one concave portion 34 in a single pixel region is effective, more effects can be realized when two or more portions 34 are formed in view of improvement in uniformity. For this purpose, the portions need be spaced apart by such a distance, i.e. pitch, for example, that two or more portions 34 are formed along the direction of the shorter side of one pixel region. Such an arrangement can be achieved by, for example, setting the distance between the points around the center of one concave portions 34 and that of the next one (arrangement interval) at approximately 10 μm. The distance, however, is not limited to 10 μm, and it can be achieved by the arrangement interval of 5 μm to 20 μm, more preferably 8 μm to approximately 15 μm depending on the diameter or taper angle of the concave portion 34. FIG. 3 shows one example of arranging the concave portions 34 formed in one pixel region. Although the areas of the R, G, and B pixels are varied in the example of FIG. 3 (the widths in the horizontal scanning direction are different in the illustrated example) in accordance with emission efficiency, at least two concave portions 34 are formed in the shorter side direction (horizontal scanning direction in this example) in each pixel region, and the same number of concave portions 34 (the minimum of three) are formed in the same pitch in the longer side direction (vertical scanning direction in this example) in each pixel in this example.

Figure 4:
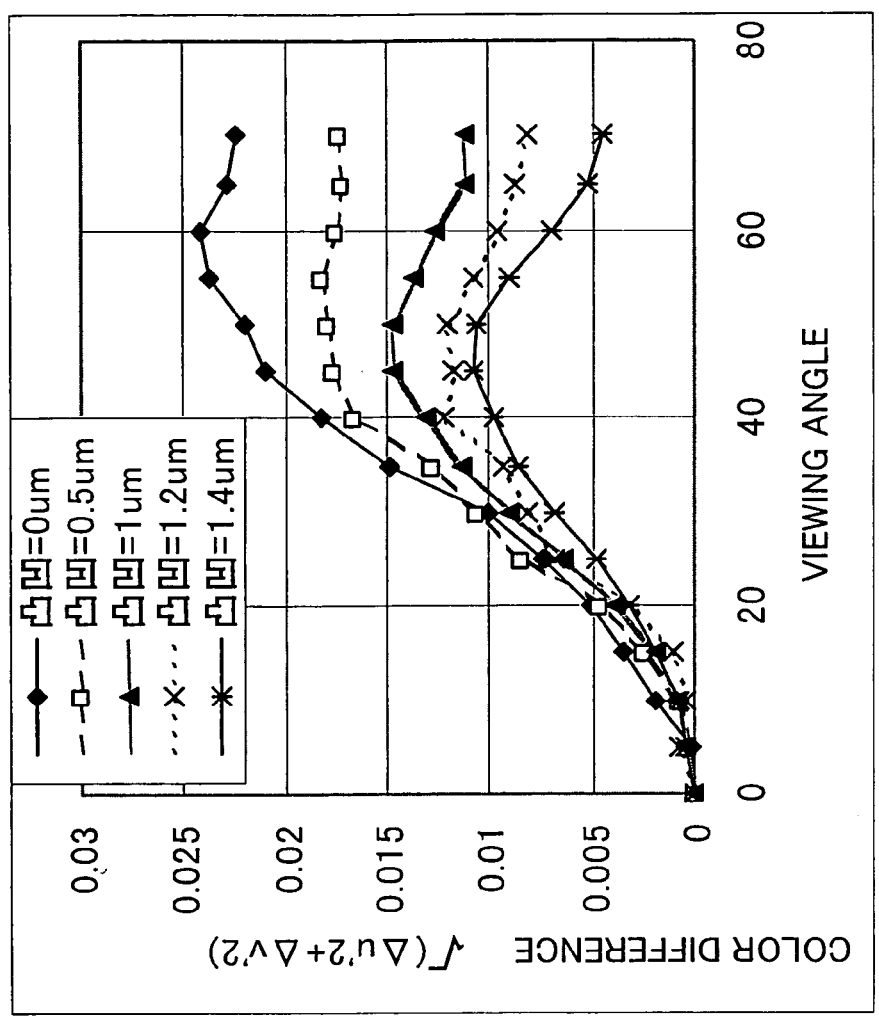
FIG. 4 shows dependency of the relationship between color difference and a viewing angle on a difference in height of the optical path length adjusting section according to the embodiment of the present invention.
Figure 5:
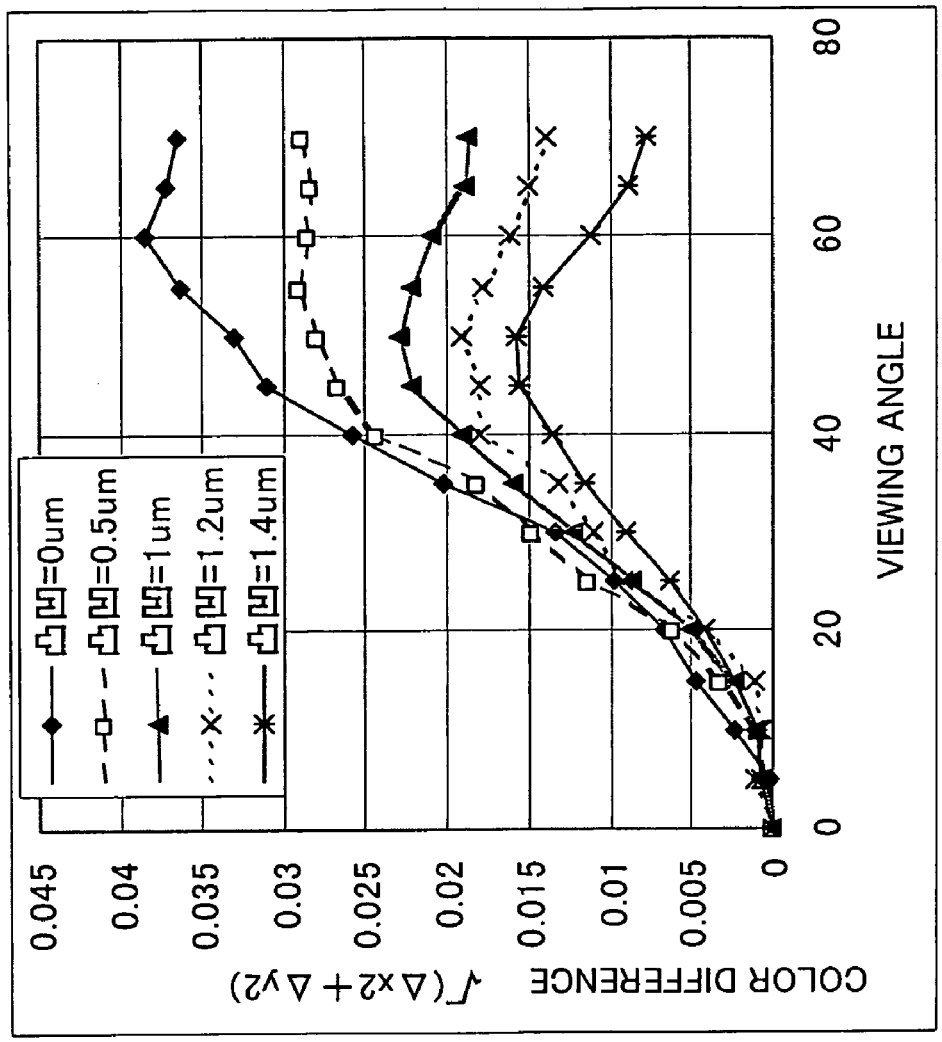
FIG. 5 shows another dependency of the relationship between color difference and a viewing angle on a difference in height of the optical path length adjusting section according to the embodiment of the present invention.

The relationship between the optical path length adjusting section 32 and the color difference of white light will next be described. FIGS. 4 and 5 show the relationship between color deviation (color difference) from the standard white light with respect to the viewing angle and the difference in height at the convexity/concavity formed in the planarization insulating layer as the optical path length adjusting section 32 in a white light emission display. The color temperature is 6500 K. The U-V coordinates $(\Delta u'2+\Delta v'2)^{1/2}$ are used as a color difference in FIG. 4, while in FIG. 5 the x-y coordinates $(\Delta x2+\Delta y2)^{1/2}$ are used as a color difference. The unit "um" in FIGS. 4 and 5 refers to "μm". Each of FIGS. 4 and 5 indicates that a change in color difference observed with an increase in the viewing angle from 0° (the direction normal to the display) is reduced as the difference in height at the convexity/concavity of the planarization insulating layer 30 increases from 0 μm to 0.5 μm, 1 μm, 1.2 μm, and 1.4 μm, and therefore that provision of the convexity/concavity with varied height as the optical path length adjusting section of the planarization insulating layer 30 contributes to suppression of color deviation caused by averaged interference. The difference in height at the convexity/concavity is preferably set so that the color difference $(\Delta u'2+\Delta v'2)^{1/2}$ in all viewing angles is smaller than 0.02, and that the color difference $(\Delta x2+\Delta y2)^{1/2}$ in all viewing angles is smaller than 0.035.

Figure 6A:
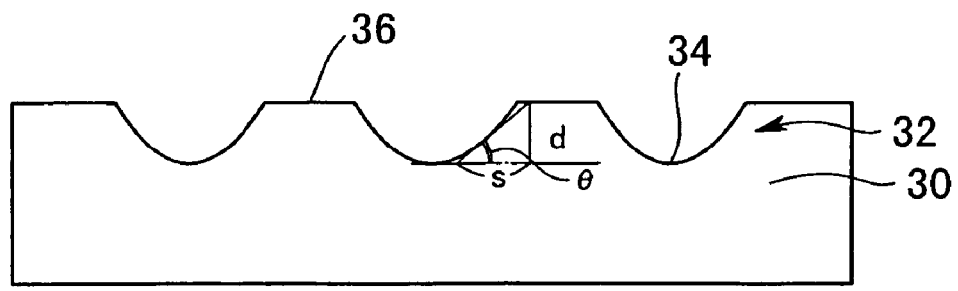
FIGS. 6(a) and 6(b) show examples of a schematic cross sectional shape of the optical path length adjusting section of the planarization insulating layer according to the embodiment of the present invention.
Figure 6B:
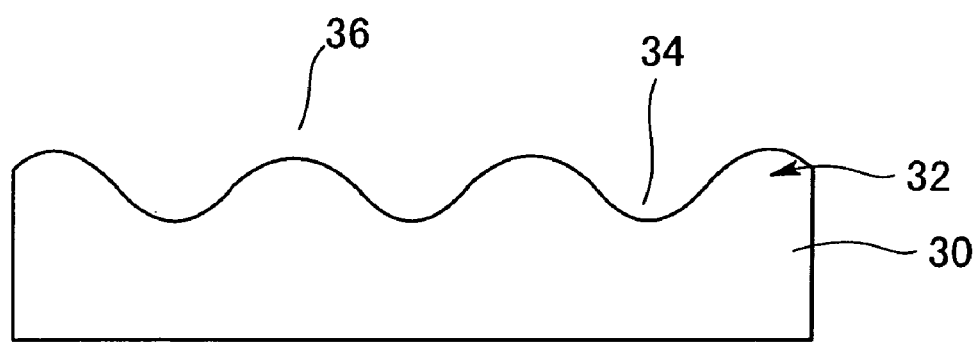

FIG. 6 shows the optical path length adjusting section 32 provided in the planarization insulating layer 30. Referring to FIG. 6(a), the convex portion 36 is formed in the gap between the concave portions 34 formed at a predetermined pitch at a surface of the planarization insulating layer 30, and this convex portion 36 may maintain a planarized surface. Alternatively, the layer may have a wavelike cross section with the concave portion 34 and the convex portion 36 linked very smoothly, as shown in FIG. 6(b). In either case, the difference "d" in height at the convexity/concavity forming irregularity at the surface (this can be expressed as the difference in height generated by the concave portion 34, or by the convex portion 36, or between the concave and convex portions) is formed greater than 0 μm and 3.0 μm or smaller.

The allowance in terms of accuracy in position of the provided concave portion 34 can be increased by providing an equal pitch between concave portions 34 in any pixel region of the plurality of pixels. Further, when a polarization film functioning as an optical component or a light shielding matrix (black matrix) is additionally used in the display, the pitch between the concave portions 34 is more preferably set so as not to cause an interference fringe with such components. When the formation pitch is the same for all pixels and the pixel area varies among R, G, and B pixels as shown in FIG. 3, the total number (sum) of the concave portions 34 formed in one pixel region varies among R, G, and B pixels. Naturally, the formation pitch may not be the same for all pixels, and may be the optimum pitch in accordance with, for example, the wavelength of light for R, G, and B because the conditions of interference depend on wavelength. The size (diameter or difference in height, or both) of the concave portions 34 may be the same for all pixels, or may be varied for each color of R, G, and B if the dependency on wavelength is significant, as described above.

The concave portion 34 and the convex portion 36 can be formed in the planarization insulating layer 30 by, for example, first forming the planarization insulating layer 30 including a photosensitive material taking into consideration the thickness required for the convex portion 36, and selectively exposing the region to function as the concave portion 34 to light to etch it away through a general photolithography method. A half exposure method can form the concave portions 34 having a stepwise difference in height in one processed surface by one exposure process. In such a half exposure method, for example, a mask having an opening corresponding to the region where the concave portion is formed is used together with a lattice pattern called a grating having a pitch of approximately 1 μm at a portion where the etching amount is small (shallow). More specifically, exposure is performed using a slit-like pattern having an opening region in one unit area reduced by the grating in addition to the above-mentioned mask, or using a half-tone mask integrally formed with the above-mentioned mask. The intensity of exposure light irradiating the photosensitive agent (the planarization insulating layer 30 including a photosensitive material in this example) is lower in the region with the grating than, for example, the completely open region without the grating, and therefore the etched depth can be controlled by adjusting the exposure amount.

An etch back method may also be employed for forming the concave portion. More specifically, a resist layer patterned with an opening corresponding to the region for forming the concave portion is formed on a target layer (the planarization insulating layer 30 in this example), and the target layer (the planarization insulating layer 30) and the resist layer are etched through dry etching or the like, so that the region corresponding to the opening of the resist layer is deeply etched (particularly, etched to a greater depth as the distance from the region where resist is provided increases), thereby forming the concave portion 34 in a pattern corresponding to the resist layer.

Further, a defocus process may be employed to obtain a tapered (especially smoothly tapered) side surface of the concave portion 34 as illustrated in FIG. 6. According to the defocus process, for example, an exposure mask is disposed at a focal position to expose the underlying planarization insulating layer 30 or the resist layer in the above-described etch back method to light, and then the exposure mask is moved to a defocused position side along the direction of the exposure light source before the layer is exposed again to light, thereby forming a region exposed with the same exposure mask but at a smaller exposure amount (because it is defocused) around a region exposed to light with the same mask at the focal position. By etching the layer after such an exposure process, the concave portion 34 having the depth and size in accordance with the exposure amount and position is eventually formed in the planarization insulating layer 30, and the cross sectional surface of the portion 34 is smoothly tapered having a diameter reduced toward the underlying layer.

Although a taper angle θ of the concave portion 34 may be 90° if only considering interference averaging, preferably the angle is 45° or smaller in order to maintain a good coverage and prevent disconnection in the very thin emitting element layer 120 formed above the planarization insulating layer 30, and therefore the angle θ is preferably in the range of 0<θ≦45° because the angle 0° means nothing. If the same etching conditions are employed, the taper angle θ can be constant even if the concave portions 34 with varying size and depth are formed. In other words, the concave portion 34 having a required size and depth can be formed with the small taper angle θ in view of maintaining good reliability of the element (maintaining good element coverage). The taper angle θ may also be varied by changing the mask and etching conditions, but it is more preferable to keep such an angle that allows good element coverage to be maintained in such a case as well.

Figure 7A:
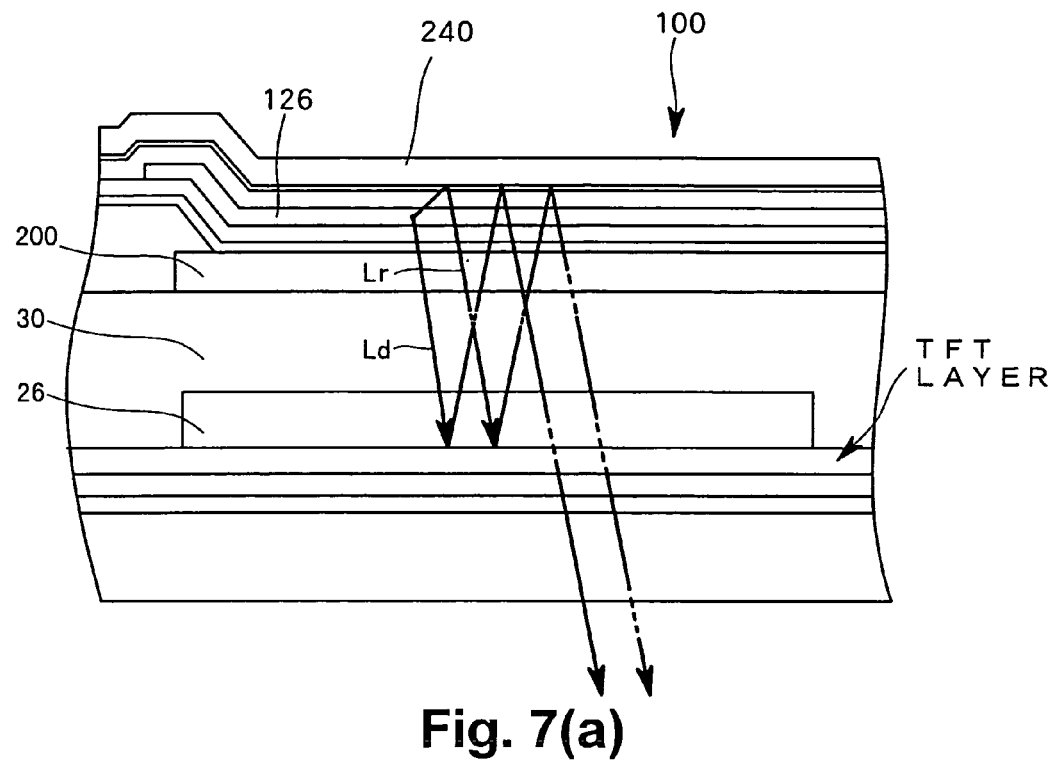
FIGS. 7(a) and 7(b) are views for describing a function of the optical path length adjusting section of the planarization insulating layer according to the embodiment of the present invention.

FIG. 7 is a conceptual view for describing how light exiting the emitting layer 126 (light source) advances and the action according to the present embodiment. FIG. 7(a) shows how light advances at a position where the optical path length from the emitting layer 126 to the substrate 10 is unchanged in one pixel region. Light generated in the emitting layer 126 and advancing toward the substrate 10 transmits through the transparent first electrode 200, the planarization insulating layer 30, and the wavelength adjusting layer 26 before reaching the TFT layer, as described above. Assuming that, for the purposes of description, all layers in the emitting element layer 120 have the same refractive index $n_{EL}$, and that light is emitted at the position located at the center of the thickness $d_{EL}$ of the emitting element layer, i.e. the distance between the emitting layer 126 and the first electrode 200 is $d_{EL}/2$, an optical path length (the shortest length) $L_1$ of the exiting light between the emitting layer 126 and the TFT layer can be expressed as:

$$L_d = n_{EL} \times d_{EL}/2 + n_{ITO} \times d_{ITO} + n_{PLN} \times d_{PLN} + n_c \times d_c.$$

In the above expression, $n_{ITO}$ and $d_{ITO}$ represent the refractive index and the thickness, respectively, of the first electrode 200 of the emitting layer ITO, $n_{PLN}$ and $d_{PLN}$ represent the refractive index and the thickness, respectively, of the planarization insulating layer 30, and $n_c$ and $d_c$ represent the refractive index and thickness, respectively, of the wavelength adjusting layer 26.

Because light from the emitting layer 126 radiates in all directions, light advancing from the emitting layer 126 toward the second electrode 240 is reflected by the second electrode 240, returns toward the emitting layer 126, and advances to the TFT layer similarly to light directly advancing toward the substrate 10 side. As a result, the optical path length (the shortest length) Lr of light, reflected by the second electrode 240 before emission, from the emitting layer 126 to the TFT layer can be expressed as:

$$Lr = n_{EL} \times 3 d_{EL}/2 + n_{ITO} \times d_{ITO} + n_{PLN} \times d_{PLN} + n_c \times d_c.$$

Thus, emission of light beams having different optical path lengths from the substrate 10 cannot be avoided in principle because of the structure of the elements, and variation in luminance or color due to interference occurs on the observation surface side in varying degrees.

Figure 7B:
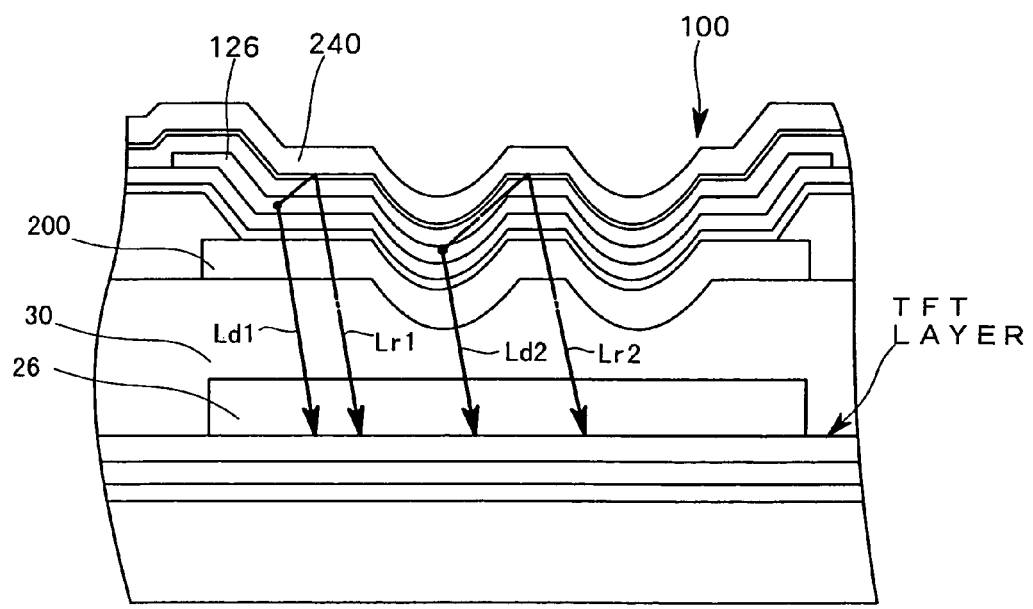

As illustrated in FIG. 7(b), however, a change in thickness of the planarization insulating layer 30 in one pixel region brought about by, for example, formation of the concave portion 34 generates at least two lengths for each of the optical path lengths Ld and Lr, namely, $Ld_1$, $Ld_2$, $Lr_1$, and $Lr_2$, wherein $Ld_1$ represents the optical path length of light advancing directly toward the substrate from the emitting layer 126 and transmitting through the convex portion (upper planarized portion in this example) 36 of the planarization insulating layer 30 before reaching the TFT layer, and $Lr_1$ represents the optical path length of light emitted by emitting layer 126, reflected by the second electrode 240, and similarly transmitting through the convex portion 36 of the planarization insulating layer 30 before reaching the TFT layer. Further, $Ld_2$ represents the optical path length of light advancing directly toward the substrate from the emitting layer 126 and transmitting through the bottom-most part of the concave portion 34 of the planarization insulating layer 30 before reaching the TFT layer, and $Lr_2$ represents the optical path length of light emitted from the emitting layer 126, reflected by the second electrode 240, and similarly transmitting through the bottom-most part of the concave portion 34 of the planarization insulating layer 30 before reaching the TFT layer.

Thus, in addition to the condition of interference between light exiting through the optical path of $Ld_1$ and light exiting through the optical path of $Lr_1$, at least the condition of interference between light exiting through the optical path of $Ld_2$ and light exiting through the optical path of $Lr_2$ is provided by changing the thickness of the planarization insulating layer 30. Consequently, interference generated on the observation surface is averaged, thereby allowing reduction of variation in luminance or color in the present embodiment. Naturally, when the concave portion of the planarization insulating layer 30 is at least formed to have a smooth cross sectional surface as illustrated in FIG. 7(b) and the cross sectional view of FIG. 1 described above, the thickness of the planarization insulating layer 30 continuously varies from the thickness of the convex portion (or upper planarized portion) 36 to the thickness of the deepest portion (bottom) of the concave portion 34, thereby producing a multitude of optical path lengths due to the change in thickness, further averaging interference.

Even if there is no difference in refractive index among the layers located on the optical path from the emitting layer 126 to the side surface of the element of the substrate 10, the emitting layer 126 also becomes concave due to the presence of the concave portion 34 of the planarization insulating layer 30 according to the present embodiment. As a result, when viewed from the substrate 10, i.e. the observation surface of the display, the emitting layer 126, i.e. the light source, is located closer to the substrate at the concave portion than the convex portion, and therefore interference of light beams exiting from one pixel region is averaged also in this respect. Because it is hard to change the thickness of the emitting element layer 120 and the like in one pixel region as described above, varying the position of the light source from the observation point in one pixel region by providing the concave portion 34 in the planarization insulating layer 30 is effective for averaging interference.

While specific description of the TFT layer will be given hereinafter, the TFT layer is mainly an insulating layer formed of, for example, SiN, $SiO_2$, or the like in the region where the organic EL element 100 is formed (emissive region). Even with an optically transmissive material, light is easily reflected at an interface between layers with different refractive indices, particularly an interface between layers with a significant difference in refractive index. By way of example, FIG. 7(a) shows a case where light from the emitting layer 126 is reflected at an interface between the wavelength adjusting layer 26 and the topmost layer (such as an $SiO_2$ layer) of the TFT layer. When light advancing directly toward the substrate from the emitting layer 126 is reflected at the TFT layer and then the second electrode 240, and finally transmits through the substrate 10 to exit outside, the light transmits through the first electrode 200 and the planarization insulating layer 30 (and the wavelength adjusting layer 26 if provided) at least three times. The planarization insulating layer 30 is often employed for planarizing the surface where the organic EL element 100 is formed to the maximum extent even when surface irregularity is generated by forming the TFT, and in such a case the layer 30 is formed in a thickness of approximately 1 μm to 4 μm. The planarization insulating layer 30 thus provided is extremely thick compared with other layers, and has a significant effect on the optical path length $Lr_{TFT}$.

The refractive index of the first electrode 200 of IZO or the like is, for example, 2.0, that of the planarization insulating layer 30 having the optical path length adjusting section 32 and formed of an acrylic resin or the like is 1.6 to 1.5, and that of the wavelength adjusting layer 26 formed of an organic material is 1.6 to 1.5 similarly to the planarization insulating layer 30. Further, the refractive index of, for example, an SiN layer of an interlayer insulating layer 20 underlying the wavelength adjusting layer 26 is approximately 1.9, and that of the $SiO_2$ layer is approximately 1.5. Light incident on the interface between layers with different refractive indices is reflected. From this viewpoint, layers having a refractive index significantly different from that of the planarization insulating layer 30 are provided both in an upper layer (the first electrode) overlying the optical path length adjusting section 32 and a lower layer (SiN layer) underlying the section 32 in the above-described multilayered structure of the present embodiment. By thus providing the optical path length adjusting section 32 at the position with a significant difference $\Delta n$ in refractive index n ($\Delta n \geq 0.2$, for example), it is very likely to generate light a1 reflected on the emitting layer (upper layer) side of the optical path length adjusting section 32 and unreflected light a2, and light b1 reflected on the substrate 10 (lower layer) side of the optical path length adjusting section 32 and unreflected light b2. In other words, the optical path length adjusting section 32 can surely change in one pixel region the optical path length of light that transmits the planarization insulating layer 30 only once, twice, three times, four times or more, as described above.

Meanwhile, the thickness of the emitting element layer 120 greatly affects emission properties of the element, and therefore a change in thickness thereof within one pixel region emitting the same color of light is not desirable. Further, because the layer is formed through vacuum vapor deposition or inkjet printing or the like, it is not easy to partially change the thickness. Regarding the emitting element layer 120, a layer formed common to all pixels is desirably formed simultaneously. This is not merely for the sake of simplified manufacturing steps, but also for the reason that it is extremely important to form the organic emitting element layer 120 having a multi-layered structure with the minimum number of steps in a completely vacuum state through successive film formation to prevent degradation, because an organic layer of the organic EL element is easily degraded by moisture, oxygen, impurities and the like. Thus, a change in thickness of the emitting element layer 120 within one pixel region is not desirable for maintaining uniform and reliable light emission of the organic EL element 100.

Further, a change in thickness of the first electrode 200 causes a change in resistance within one pixel region. Particularly when a transparent conductive metal oxide material, such as ITO and IZO, is used for a material of the first electrode 200, such a material has a greater resistance than materials such as Al, while a low resistance is required for maintaining the uniform amount of electric charges injected into the organic EL element 100 and preventing heat generation, and it is desirable to form the thickest possible electrode but not so thick as to cause a decrease in transmittance. With these requirements in mind, it is not preferable to provide the first electrode 200 with a locally reduced thickness.

On the other hand, by changing the thickness of the thick planarization insulating layer 30 in one pixel region, which would only make a small impact on emissive properties and the like of the organic EL element 100 even if the layer has a partially changed thickness, as in the present embodiment, the optical path length of light exiting outside from the organic EL element 100 can be adjusted most effectively.

The TFT layer will be described with reference to FIG. 1 described above. Covering the surface of the substrate 10, a buffer layer (having a stacked layer structure including an SiN layer and an SiO$_2$ layer provided from the substrate side) 12 for preventing impurities from penetrating the TFT from the substrate is formed. On this buffer layer 12, a polycrystalline silicon layer 14 formed by performing low temperature polycrystallization on amorphous silicon through laser annealing is formed as a TFT active layer. Over the entire substrate surface covering the polycrystalline silicon layer 14, a gate insulating layer 16 of a dual layer structure including, for example, an SiO$_2$ layer and an SiN layer stacked in the above-mentioned order from the polycrystalline silicon layer 14 side is formed.

On the gate insulating layer 16, a refractory metal material layer including Cr, Mo, or the like is formed as a gate electrode material, patterned to be left above a channel formation region of the polycrystalline silicon layer 14 sandwiching the gate insulating layer 16, and functioning as a gate electrode 18 of the TFT. Note that the gate line GL and the capacitor line SL shown in FIG. 2 are also simultaneously formed by patterning such a refractory metal material layer. The interlayer insulating layer 20 is formed at a position covering the entire substrate surface including the gate electrode 18.

The interlayer insulating layer 20 has a layered-structure including, for example, an SiN layer and an SiO$_2$ layer stacked in the above-mentioned order from the substrate side. On the interlayer insulating layer 20, the data line DL (see FIG. 2) of a low resistance material, such as Al, and the power source line PL are formed, and correspondingly connected to the first conductive region (see FIG. 2) of the TFT1 and the first conductive region of the TFT2 (a source region 14s in FIGS. 1 and 2), through contact holes formed through the interlayer insulating layer 20 and the gate insulating layer 16.

These layers formed on the substrate basically form the TFT layer, and a TFT formation region, a storage capacitor region, and a wiring line region are usually disposed in a non-emissive region or a light shielding region (the non-emissive region corresponds to, for example, a region where the first electrode 200 and the second electrode 240 of the organic EL element 100 do not directly face each other sandwiching the emitting element layer 120). Consequently, on the optical path from the emitting layer 126 to the substrate 10 in the emissive region to be particularly noted in this embodiment, the first electrode 200, the planarization insulating layer 30 (optical path length adjusting section 32), the wavelength adjusting layer 26, the interlayer insulating layer 20, the gate insulating layer 16, and the buffer layer 12 are provided, as illustrated in FIG. 1.

Light emitted from the organic EL element is caused by organic emissive molecules, and for a color display device with R, G, and B, different emissive materials may be used for R, G, and B with the emitting layer 126 formed as an individual pattern for each pixel. In such a case, the emitting layer 126 is formed for each of R, G, and B pixels, at least in a pattern separated for R, G, and B in order to prevent color mixture, and films are formed in different steps.

Meanwhile, the same emissive material can be used as the emitting layer 126 for all pixels, and the same white emitting layer can be employed for all pixels. In such a case, white emission can be achieved through color addition by, for example, providing the emitting layer 126 with a stacked layer structure including an orange emission layer and a blue emission layer, i.e. layers emitting light of complementary colors. When such a white emission EL element is used for all pixels, all layers of the organic emitting element layer 120 can be formed in common to all pixels, but may also be individually patterned for the purpose of more accurately defining the emissive region of each pixel to enhance contrast and other purposes. By way of example, an individually patterned white emission layer 126 can be obtained through, and simultaneously with, formation of a film using a mask having an opening corresponding to each pixel region (through, for example, vacuum vapor deposition). In this example, other layers, namely, the hole injection layer 122, the hole transport layer 124, the electron transport layer 128, and the electron injection layer 130 are formed common to all pixels (or can be individually patterned for each pixel in a desired size using a mask), and the second electrode 240 is also formed in common to all pixels. While full color display can be achieved by providing a wavelength adjusting layer (color filter) 26 for R, G, or B corresponding to each pixel, a display presenting a full color image in four colors, i.e. R, G, B, and W (white), capable of improving display luminance and reduction in power consumption may be implemented by providing a pixel directly emitting white light, in addition to R, G, and B, without providing the wavelength adjusting layer 26. That is, interference can be averaged by providing the above-described optical path length adjusting section 32 in each pixel of R, G, B, and W (at least the pixel of any of these colors).

While the organic emitting element layer 120 has a function of transporting holes or electrons, it has a high resistance, and electric charges are injected only to the region of the layer 120 where the first and second electrodes 200 and 240 directly face each other sandwiching the organic emitting element layer 120, whereby the emissive region of the organic EL element 100 is this particular region where the first electrode 200 and the second electrode 240 directly face each other. Note that an end region of the first electrode 200 is covered with the planarization insulating layer 140 in the present embodiment in order to maintain coverage of the very thin emitting element layer 120 to prevent a short circuit between the first electrode 200 and the second electrode 240, and that the opening region of the planarization insulating layer 140 located on the first electrode 200 (the region of the first electrode 200 uncovered with the planarization insulating layer 140) functions as the emissive region of the organic EL element 100 in the present embodiment.

While an example in which the so-called active matrix organic EL display device having a switch element for each pixel to individually control an organic EL element is employed has been described above in this embodiment, the same effects can be realized in the so-called passive matrix display device, in which a switch element is not provided for each pixel, by providing the planarization insulating layer 30 and forming a concave portion under the first electrode 200 provided in the form of a plurality of stripes. More specifically, one pixel region is formed as a region where the first electrode 200 and the second electrode 240, formed sandwiching the emitting element layer 120 with the first electrode 200 and extending in a stripe-like manner in a direction crossing the first electrode 200, face each other. By forming the optical path length adjusting section in the planarization insulating layer 30 in the above-described one pixel region, interference can be averaged in a single pixel. For a passive matrix display, convexity/concavity can be formed as the optical path length adjusting section directly on the substrate of, for example, glass where the element is formed. Such a method eliminates the need for additionally providing a layer for the purpose of interference averaging.

Optical properties obtained by the optical path length adjusting section of the present embodiment will next be described. First, below is described a panel having convexity/concavity in the planarization insulating layer 30 for adjusting the optical path length in a configuration where the same organic EL element 100 is used for each pixel as shown in FIG. 1, and the generated white light (achieved by adding orange light and blue light) transmits a color filter (having a thickness of 1.5 μm) to obtain light of R, G, and B.

FIG. 8(*a*)-FIG. 8(*c*) show wavelength spectra of the R, G, and B light obtained in such a panel. The graphs show in a solid line the waveform of R, G, and B light in the panel in which the concave portions 34 having a depth of 1 μm are formed in the planarization insulating layer 30 at an interval of 10 μm in each pixel region. The broken line in the graph indicates the waveform of the element in the case where the planarization insulating layer 30 has a uniform thickness and the optical path length is not varied in one pixel region, given as an example for comparison. In the comparison examples, each of the R, G, and B light has a particularly high intensity at a plurality of wavelengths. On the other hand, it can be seen that provision of a plurality of optical path lengths as in the present embodiment contributes to a reduction in number of peaks and to a smoother waveform, averaging and reducing interference. Further, peaks at a plurality of wavelengths result in variation in color due to a subtle deviation of the peak, and therefore the present embodiment is also effective to prevent such a variation in color.

FIG. 8(*d*)-FIG. 8(*f*) show how R, G, B light obtained from a similar element depends on the angle, i.e. the relationship between the observation angle and the change in luminance when the direction normal to the observation surface is 0 degrees. Similarly to FIG. 8(*a*)-FIG. 8(*c*), the broken line indicates the properties of the panel in a comparison example in which the optical path length is unchanged in one pixel region, and the solid line indicates the properties of the panel of the present embodiment in which the optical path length is varied in one pixel region.

For red and green light, a viewing angle equivalent to or greater than that in the comparison example is obtained according to the present embodiment, as shown in FIG. 8(*d*) and FIG. 8(*e*). While the luminance changes as the observation angle increases from 0 degrees, a change in intensity is suppressed to 30% or smaller for red and green light.

For blue light, the change in intensity shows improvement in terms of angle dependency compared to the comparison example: while a decrease up to approximately 50% is observed in the comparison example, it is suppressed to a maximum of 40% in the present embodiment. Consequently, the viewing angle shows approximately equivalent change in intensity for any of R, G, and B, and it is understood that appropriate white balance at substantially the same level as that observed from the front can be maintained at any position. Consequently, the angle dependency according to the color of emitted light is improved, thereby achieving appropriate color display that can be viewed at any angle.

The characteristics observed when the optical path length is varied in one pixel region as in the present embodiment in a panel formed by applying different emissive materials for different colors of R, G, and B, i.e. different organic EL elements are formed for R, G, and B (hereinafter referred to as a color separate provision method), will be described in contrast to a comparison example where the optical path length is unchanged.

FIG. 9(*a*)-FIG. 9(*c*) show wavelength spectra of R, G, B light similarly to FIG. 8(*a*)-FIG. 8(*c*) described above. The concave portion 34 formed in the planarization insulating layer 30 has a depth of 1 μm and is provided at a pitch of 10 μm for each of R, G, and B pixels. Also for a color separate provision panel, the panel of the present embodiment (solid line) shows a reduced number of peaks with a smooth waveform for any of R, G, and B light similarly to the line in FIG. 8. This indicates that interference is averaged and reduced.

FIG. 9(*d*)-FIG. 9(*f*) show angle dependency of each color of R, G, and B similarly to FIG. 8(*d*)-FIG. 8(*f*) described above. In the panel of the present embodiment (a solid line) obtained by providing the optical path length adjusting section in a color separate provision panel, the change in luminance with an increase in the observation angle is suppressed to approximately 2% to approximately 8% for R and G light, and approximately 15% for B light, indicating that significant improvement is achieved in terms of change in luminance (particularly prevention of decrease). It is further understood that deviation in white balance between different observation angles can be prevented because luminance of R, G, and B light is substantially equal for each observation angle.

As the result of FIG. 9 shows, blue light has different properties from green and red light when the depth of the concave portion is the same for all pixels, and therefore the portion may be provided with a different depth for blue light. More specifically, blue light has such properties that the angle dependency of the luminance change is smaller in the comparison example, and therefore no concave portion may be provided or the depth "d" of the concave portion may be reduced for blue. With use of the above-described half exposure method, it is easy to change the depth only in the blue regions. Naturally, such a modification is not limited to blue, and the optical path length adjusting section 32 may be formed or may not be formed, or the depth "d" or the formation pitch or the like may be varied, only for pixels of another color depending on the conditions. Note that, when pixels are arranged, for example, in the Δ arrangement and the layout and shape of pixels for the same color are varied with the row, more preferably adjustment is made in accordance with the shape of each pixel so that the pitch between the optical path length adjusting sections 32 or the like becomes equal for pixels of the same color. On the other hand, the conditions (size, depth, pitch, or the like) of the above-described optical path length adjusting section 32 may be varied even among the pixels of the same color in accordance with the position of pixels on the display. This is because, when a user looks at the display from a certain viewpoint, the viewing angle at the front is different from that in a peripheral region because the position is different, and therefore the luminance change properties may be different as described above.

Further, similarly an extremely small formation pitch between the concave portions 34 is likely to cause scattering or the like, and convexity/concavity at the surface where the organic EL element 100 is formed cannot be neglected, as a result of which it may become hard to completely cover the convexity/concavity with the emitting element layer 120 and the like, and impair reliability. From this viewpoint as well, more preferably the side surface of the concave portion 34 is tapered. The difference in height (depth) "d" of the concave portion 34, the taper angle θ of the side surface of the portion 34, and the radius (corresponding to size and formation pitch) "s" shown in FIG. 6 preferably satisfy the following conditions: $0.1\ \mu m \leq d \leq 3.0\ \mu m$, $0° < \theta \leq 45°$, $2s = 2d/\tan\theta$.

[Optical Path Length Adjustment Due to Ion implantation]

Figure 10:
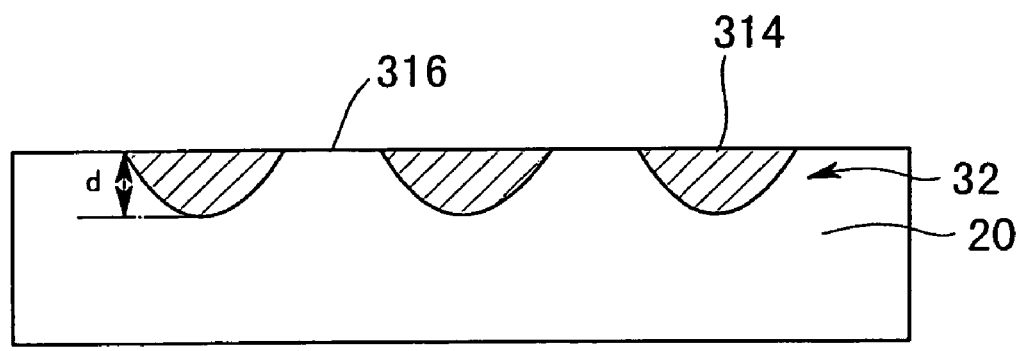
FIG. 10 shows another example of the optical path length adjusting section according to the embodiment of the present invention.

FIG. 10 shows another example of the optical path length adjusting section 32, in which an ion implanted region 314 is formed in a predetermined insulating layer, such as the SiN layer (or $SiO_2$ layer) used for the interlayer insulating layer 20, the gate insulating layer 16, and the like forming the TFT layer, thereby locally varying the refractive index from a non-implanted region 316 to adjust the optical path length. The implanted ions are not particularly limited as long as the refractive index can be varied from that of the non-implanted portion, and metal ions, such as K, Fe, Cu, may be used, to name a few. The implantation target is not limited to the above-described insulating layer, and may be the substrate 10 where elements are formed. Similarly to physically forming convexity/concavity in the planarization insulating layer 30 and the like as described above, in order to fulfill the function of varying the optical path length, implantation ions and implantation depth "d" should be chosen so that the product Δnd of the depth "d" and the difference Δn in refractive index between the non-implanted region 316 and the implanted region 314 satisfies the condition of, for example: $\Delta n d \approx 1.6 \times 1000$ nm=approximately 1600 nm.

[Top Emission]

Figure 11:
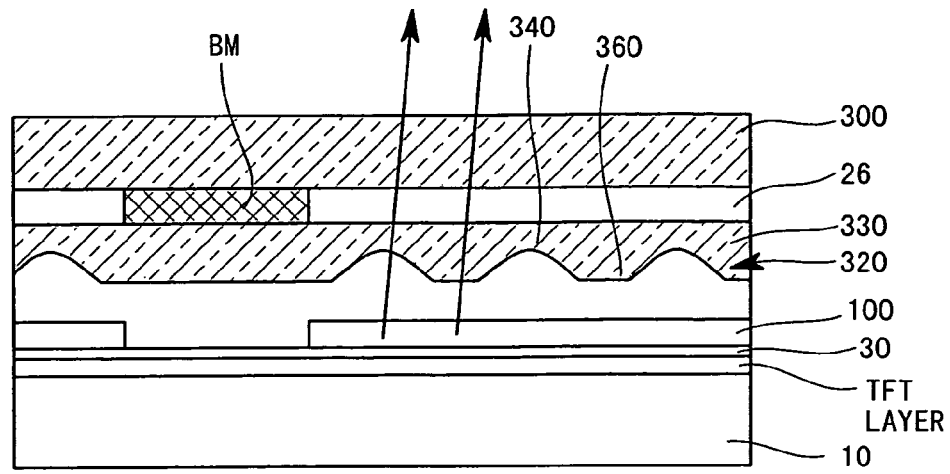
FIG. 11 schematically shows a cross sectional structure of a top emission type organic EL display device according to the embodiment of the present invention.
Figure 12:
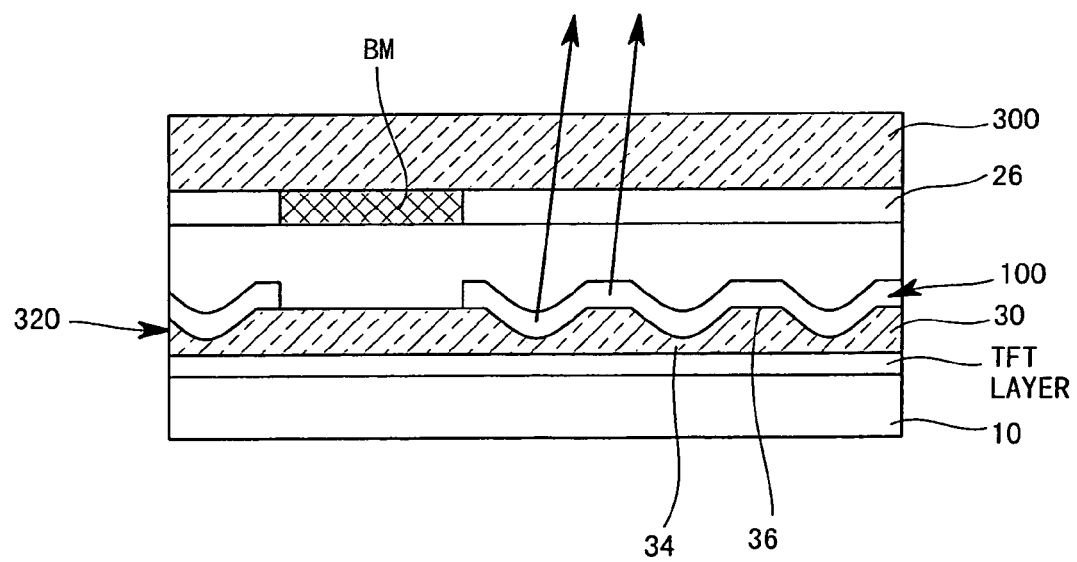
FIG. 12 schematically shows another cross sectional structure of the top emission type organic EL display device according to the embodiment of the present invention.

While the above description relates to the light emitting display of the so-called bottom emission type in which light is emitted from the side of the substrate (first substrate) where the organic EL element is formed and the optical path length adjustment between the element and the surface of the first substrate on the observation side in such a display, the optical path length adjusting section may be provided to form a region having a different optical path length in one pixel region in a light emitting display of the so-called top emission type in which light exits outside from the side of a second substrate sealed to the surface of the first substrate where the element is formed. FIGS. 11 and 12 show examples of optical path length adjustment in such a light emitting display of the top emission type. Referring to FIG. 11, the wavelength adjusting layer (such as a color filter) 26 is formed on a second substrate 300 where necessary, a planarization insulating layer 330 is formed to cover the wavelength adjusting layer 26, and a concave portion 340 and a convex portion 360 are formed as optical path length adjusting sections 320 on the side of the planarization insulating layer 330 facing the element. In such a structure, the function similar to the optical path length adjusting section 32 shown in FIG. 1 and the like described above can be fulfilled.

In FIG. 12, the optical path length adjusting section 32 is formed in the planarization insulating layer 30 formed under the organic EL element 100 on the first substrate 10 side, similarly to the above-described configuration in FIG. 1 and the like, and the wavelength adjusting layer 26 is formed where necessary on the second substrate 300 side. The optical path length adjusting section 32 in this configuration performs the function of varying the optical path length from the emitting layer to the observation surface side of the second substrate 300 by providing convexity/concavity in the emitting element layer in accordance with the convexity/concavity thereof.

The configuration of adjusting the optical path length in one pixel region described above is effective either in a bottom emission type EL display for causing light obtained in the emitting layer to exit outside from the first electrode 200 side as illustrated in FIG. 1, or in a top emission type EL display for causing light obtained in the emitting layer to exit outside from the second electrode side (second substrate 300 side) as illustrated in FIG. 11 or FIG. 12, and also similarly effective in a display having a microcavity mechanism for amplifying light obtained in the element through resonance. The microcavity mechanism can be achieved by designing, for example, the electrode positioned on the light emission side as a semi-transmissive electrode (or a stacked structure including a transparent electrode material layer and a reflective material layer) rather than a transparent electrode so that the optical path length between the semi-transmissive electrode and the reflective electrode located opposite thereto coincides with the resonant wavelength.

Other Specific Examples

Figure 13:
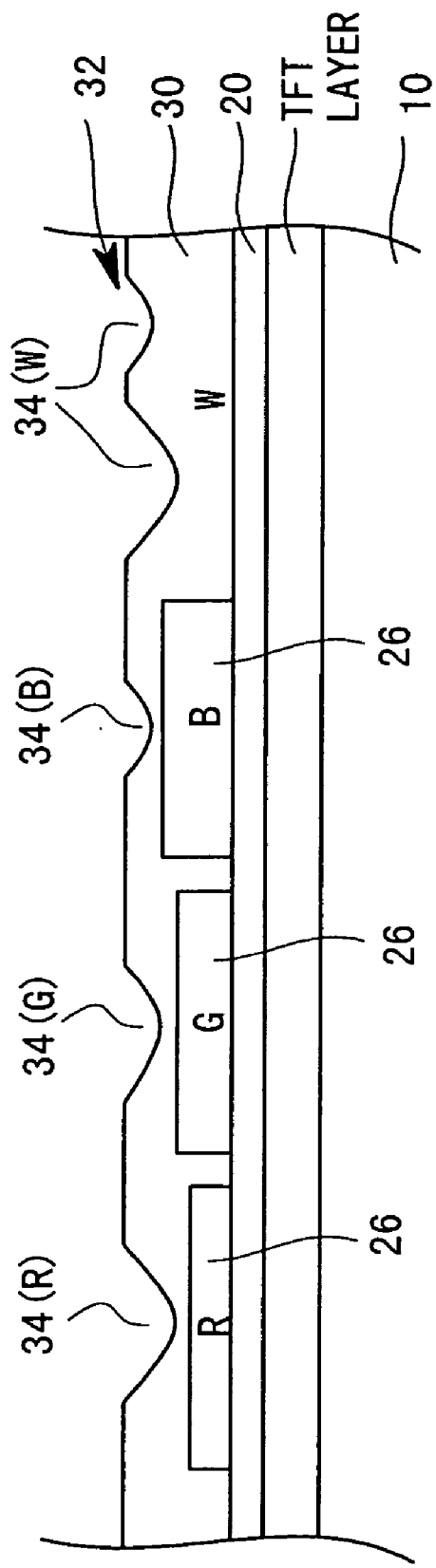
FIG. 13 is a schematic cross sectional view showing another example of the optical path length adjusting section of the organic EL display device different from the one in FIG. 1 according to the embodiment of the present invention.

FIG. 13 shows in cross section an important part of a configuration example in which the organic EL elements emitting the same color of light are employed for all pixels as illustrated in FIG. 1 and the depth of the convexity/concavity of the optical path length adjusting section 32 is varied in accordance with the displayed color associated with each pixel as described above. On the interlayer insulating layer 20 covering the TFT (not shown) layer, the wavelength conversion layer (color filter layer) 26 for R, G, or B is provided in accordance with the displayed color associated with each pixel. The pixel for which the wavelength conversion layer 26 is not formed is a pixel for displaying white (W) used when a white light emission organic EL element is used. In other words, when a pixel for displaying white (W) is provided in addition to pixels for R, G, and B to form one pixel unit composed of four colors, i.e. R, G, B, and W, white light from the organic EL element is directly emitted outside in the W displaying pixel.

The wavelength conversion layers 26 for R, G, and B are formed of different materials because white light is turned into red, green, and blue light, respectively. As a result, these conversion layers 26 often have different thickness for R, G, and B, as illustrated in FIG. 13. In addition, no conversion layer 26 is provided for W pixels as described above. Consequently, in such a configuration the planarization insulating layer 30 formed to cover such conversion layers 26 has a thickness varied in pixel regions for different colors. The thickness of the concave portion 34 that can be formed in the planarization insulating layer 30 is varied with the color in each pixel region. As illustrated in FIG. 13, when the provided planarization insulating layer 30 is thick (the conversion layer 26 is thin) in a pixel region where the concave portion 34 is required to have a large depth, the concave portion 34 having an optimum depth for each pixel region can be formed without setting the thickness of the planarization insulating layer 30 formed over the entire substrate surface to a high value in accordance with the deepest concave portion 34 with no fear of exposing the wavelength conversion layer 26. Note that the emitted light does not have a single wavelength in a pixel for displaying white, and therefore a plurality of concave portions 34 having different depths are formed in the same pixel region so that accurate white light can be emitted outside, as illustrated in FIG. 13.

Figure 14:
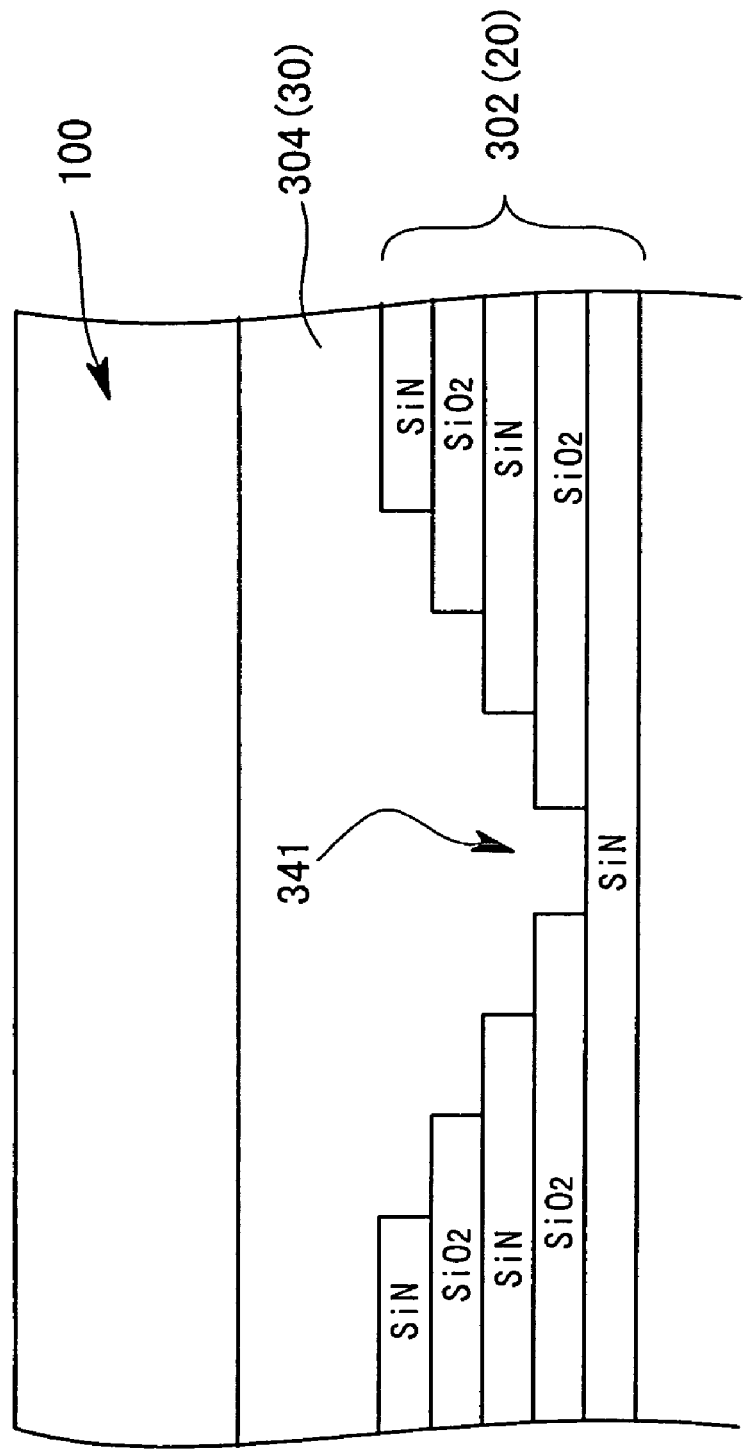
FIG. 14 is a schematic cross sectional view showing another structure example of the optical path length adjusting section of the organic EL display device according to the embodiment of the present invention.

FIG. 14 shows another configuration example of the optical path length adjusting section 32. In the example of FIG. 14, convexity/concavity is first formed in a predetermined first insulating layer 302, and a second insulating layer 304 of a material having a different refractive index from the first insulating layer 302 is formed to fill in the concavity of the surface, so that the upper surface of the second insulating layer 304 is smoothed. When the organic EL element 100 is formed on the second insulating layer 304, the element formation surface is preferably planarized in view of improvement in element reliability, as described above. The configuration in FIG. 14 makes it possible to maintain flatness of the element formation layer, i.e. the upper surface of the second insulating layer 304. Because convexity/concavity is formed in the first insulating layer 302 and the concavity is filled with the second insulating layer 304, each thickness of the first and second insulating layers 302 and 304, i.e. each optical path length of the first and second insulating layers, can be varied in one pixel region. More specifically, stacked layers of SiN and $SiO_2$ used for the interlayer insulating layer 20 can be used, for example, for the first insulating layer 302 as well, and the planarization insulating layer 30 can be used as the second insulating layer 304. As described above, the refractive index of SiN is approximately 1.9, that of $SiO_2$ is approximately 1.5, and that of the planarization insulating material is approximately 1.6 to 1.5. A concave portion 341 can be formed by, for example, providing the first insulating layer 302 with a multi-layered structure including $SiN/SiO_2/SiN/SiO_2/SiN$ from the bottom and an opening successively formed in each layer with a width increasing upward. By filling in the thus provided concave portion 341 with the second insulating layer 304 of a planarization insulating material, a plurality of distances (three in the example of FIG. 14) can be obtained between the surface of the second insulating layer 304 and the surface of each SiN layer of the first insulating layer 302, so that the portion can function as the optical path length adjusting section 32.

Figure 15:
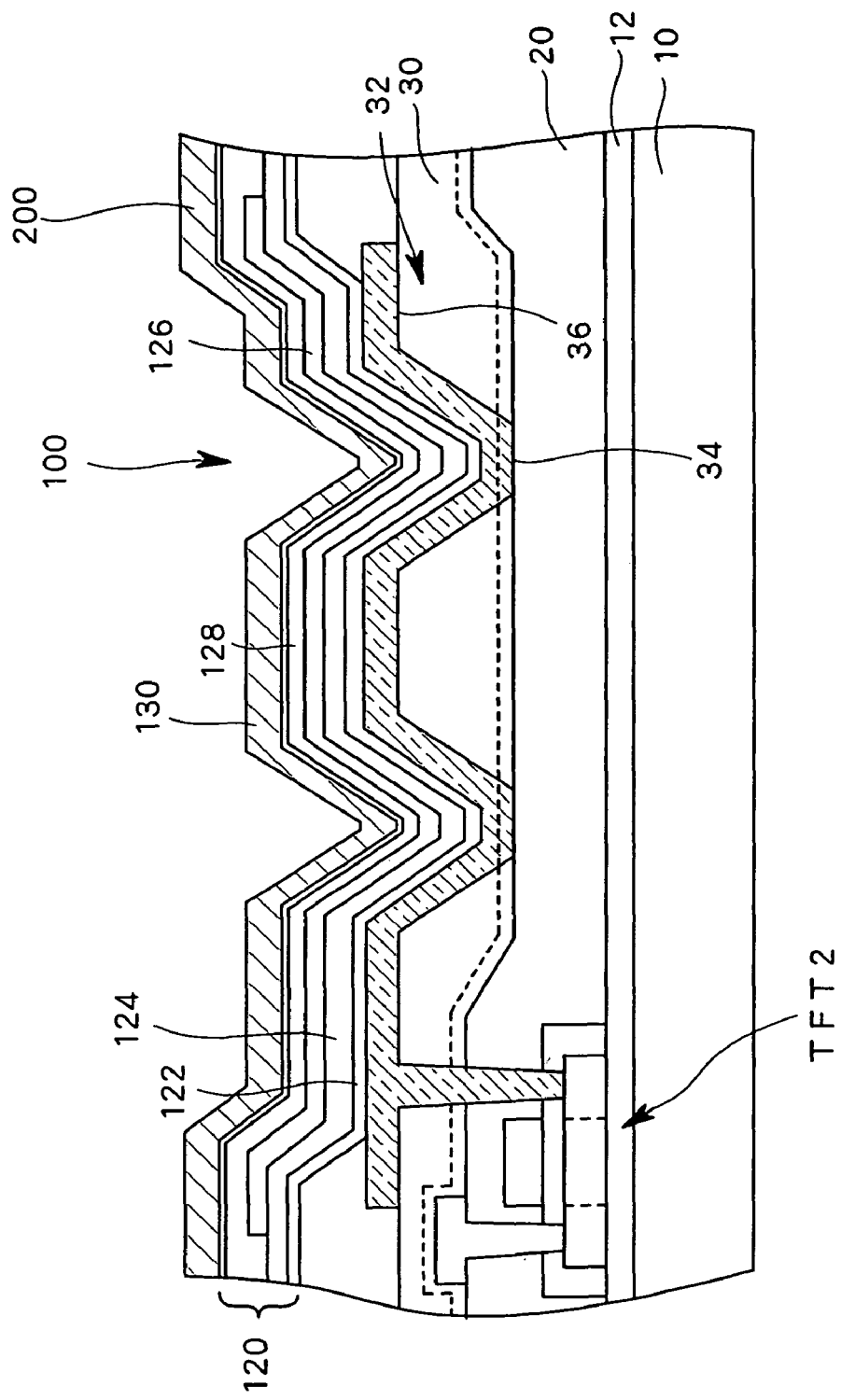
FIG. 15 is a schematic cross sectional view showing a further structure example of the optical path length adjusting section of the organic EL display device according to the embodiment of the present invention.

FIG. 15 shows another configuration example of the optical path length adjusting section 32 of a light emitting display panel in which at least emissive materials of the organic EL element are applied separately for R, G, and B pixels according to the so-called color separate provision method. Elements the same as those in FIG. 1 are labeled with the same characters, and description thereof will not be repeated. In contrast to the example of FIG. 1, the wavelength conversion layer 26 is not particularly necessary for each pixel of R, G, and B in the color separate provision method. Therefore, the planarization insulating layer 30 is formed on the interlayer insulating layer 20. In the example of FIG. 15, the concave portion 34 is formed in the planarization insulating layer 30 with its depth penetrating the layer 30. That is, the surface of the underlying interlayer insulating layer 20 is exposed at the bottom of the concave portion 34. In such a case as well, the taper angle θ of the concave portion 34 is preferably minimized (although it is shown as a large angle in FIG. 15 for illustration purpose) in order to maintain reliability of the overlying organic EL element, and suitably smaller than 45°. In this configuration, the planarization insulating layer 30 having a thickness of, for example, approximately 1 μm allows formation of the concave portion 34 penetrating the planarization insulating layer 30 with a small taper angle θ. Further, as described above, the concave portion 34 having a depth of approximately 1 μm can be obtained with an arrangement interval of, for example, approximately 10 μm.

By thus forming the concave portion 34 penetrating the planarization insulating layer 30, the first electrode (ITO) 200 of the organic EL element formed on the planarization insulating layer 30 is brought into contact with the interlayer insulating layer 20 at the bottom of the concave portion 34. Note that an SiN layer is preferably provided as the topmost layer of the interlayer insulating layer 20 (for example, a triple layered configuration composed of $SiN/SiO_2/SiN$ from the TFT side is employed). This contributes to a greater difference in refractive index of approximately 0.4 at an interface between the first electrode (ITO) 200 and the planarization insulating layer 30 (the refractive index of ITO: 1.9, the refractive index of the planarization insulating layer: 1.5) compared with the refractive index difference of approximately 0.1 at an interface between the first electrode and the interlayer insulating layer 20 (the refractive index of ITO: 1.9, the refractive index of SiN: 2.0). Consequently, the optical path length of light from the organic EL element 100 can be actively changed according to whether or not the concave portion 34 is present. Thus, a sufficient difference in optical path length can be obtained even if the planarization insulating layer 30 has a thickness of, for example, 1 μm or smaller.

After forming the power source line PL, the unillustrated data line DL, and the like, an SiN layer may be formed as a protection layer over the entire substrate surface covering such lines before forming the planarization insulating layer 30 as indicated by a broken line in FIG. 15 (the interlayer insulating layer need not include three layers in this case), whereby a significant difference in refractive index can similarly be obtained between a site where the protection layer is exposed at the bottom of the concave portion 34 and a site where the planarization insulating layer 30 is present. Consequently, the optical path length can be more actively changed similarly to the above-described configuration, and a thin planarization insulating layer 30 can be used. Further, a thinner layer can be used in the configuration of FIG. 15 as an insulating layer for forming the concave portion 34 constituting the optical path length adjusting section 32, so that the configuration is not limited to that using a planarization insulating material, and an insulating layer of a material with a similar refractive index to that of the planarization insulating material, such as $SiO_2$, can also be used.

Although a light emitting display using an organic EL element as an emitting element has been described as an example, the above effects can also be obtained with other thin film emitting elements, such as an inorganic EL element.

INDUSTRIAL APPLICABILITY

The invention is applicable to a light emitting display including an emitting element for each pixel.

The invention claimed is:
1. A light emitting display comprising a plurality of pixels, each having an emitting element in which an emitting element layer including at least an emitting layer between a first electrode and a second electrode is formed, the emitting element being formed above a first substrate, and a light from the emitting element being emitted outside, wherein an insulating layer is formed between the emitting element and a surface of the display on an observation side, convexity/concavity is physically formed in one or more pixel regions in the insulating layer, and an optical path length adjusting section is formed for adjusting an optical path length from the emitting layer to the surface of the display on the observation side, an arrangement interval of the convexity/concavity diameter is approximately 10 μm, and a plurality of optical path lengths from the emitting layer to the surface of the display on the observation side are formed in one pixel region by the optical path length adjusting section, and a plurality of interference generating conditions are set in one pixel region.

2. A light emitting display according to claim 1, wherein the optical path length adjusting section is provided only in an emissive region within each pixel region.

3. A light emitting display according to claim 1, wherein said each pixel is provided with a circuit element including one or more switch elements formed above the first substrate for controlling the emitting element.

4. A light emitting display according to claim 1, wherein the convexity/concavity is formed in a planarization insulating layer formed between the emitting layer and the first substrate.

5. A light emitting display according to claim 1, wherein a second substrate is provided in a sealed manner on a side of the first substrate where the emitting element is formed, the convexity/concavity is formed in an insulating layer between the emitting layer and the second substrate, and light from the emitting element transmits through the second substrate, and exits outside.

6. A light emitting display comprising a plurality of pixels for emitting light from an emitting element to outside, wherein each pixel includes the emitting element in which an emitting element layer including at least an emitting layer between first and second electrodes is formed, and a circuit element formed between layers of the emitting element and a first substrate and including one or more switch elements for controlling the emitting element for each pixel, an insulating layer is formed between layers of the circuit element and the emitting element connected to a corresponding one of the switch elements, in the insulating layer, in one or more pixel regions, convexity/concavity is selectively formed only in an emissive region of the pixel region, and an optical path length adjusting section is formed for adjusting an optical path length from the emitting layer to a surface of the display on an observation side, and a plurality of optical path lengths are formed in one pixel region from the emitting layer to the surface of the display on the observation side by the optical path length adjusting section, and a plurality of interference generating conditions are set in one pixel region, and a taper angle of a bottom of the concave portion forming the convexity/concavity with respect to a direction of a flat surface of the substrate is greater than 0", and equal to or smaller than 45".

7. A light emitting display according to claim 6, wherein two or more concave or convex portions of the convexity/concavity formed in the insulating layer are formed juxtaposed in a direction of a shorter side of said one pixel region, and a difference in height in the convexity/concavity is greater than 0 μm, and equal to or smaller than 3.0 μm.

8. A light emitting display according to claim 6, comprising
at least one pixel different from the remaining pixels in terms of at least one of the size of the concave or convex portion forming the convexity/concavity and the total number thereof in one pixel region in accordance with a displayed color associated with each pixel.

9. A light emitting display according to claim 6, comprising
at least one pixel different from the remaining pixels in terms of a difference in height in the convexity/concavity in each pixel region of the plurality of pixels in accordance with the displayed color associated with each pixel.

10. A light emitting display according to claim 6, wherein an arrangement interval between concave portions or between convex portions forming the convexity/concavity in one pixel region is the same at least in the pixel regions for the same color among the plurality of pixels.

11. A light emitting display according to claim 6, wherein an arrangement interval between the concave portions forming the convexity/concavity in one pixel region is varied in accordance with a position of the plurality of pixels on the display.

12. A light emitting display according to claim 6, wherein a planarization layer having a refractive index different from that of the insulating layer is formed covering the insulating layer, convexity/concavity of the surface generated by the convexity/concavity of the insulating layer is planarized by the planarization layer, and the emitting element is formed above the planarization layer.

13. A light emitting display according to claim 6, wherein a taper angle of a bottom of the convexity/concavity with respect to a direction of a flat surface of the substrate is constant for each pixel having the convexity/concavity formed therein.

14. A light emitting display according to claim 6, wherein the emitting layer emits light of the same wavelength in any of the plurality of pixels, and
between the emitting element and the surface of the display on the observation side, a wavelength adjusting layer for obtaining an associated color is formed at least in some pixels of the plurality of the pixels.

15. A light emitting display according to claim 6, wherein the emitting layer emits light of an associated color in the plurality of pixels, and
of the light emitted by the emitting element to outside through the first substrate or the second substrate in one pixel region, at least the light transmitting through the optical path length adjusting section has an optical path length which differs from that of the light that does not transmit through the optical path length adjusting section.

16. A light emitting display according to claim 6, wherein the insulating layer where the convexity/concavity is formed is a planarization insulating layer.

17. A light emitting display according to claim 16, wherein the emitting element is formed in a stacked manner on the planarization insulating layer.

18. A light emitting display according to claim 6, wherein a difference in height of the convexity/concavity of the insulating layer forming the optical path length adjusting section is set so that a color difference expressed by U-V coordinates $(\Delta u'2+\Delta v'2)^{1/2}$ with respect to a change in viewing angle of emitted light is smaller than 0.02.

19. A light emitting display according to claim 6, wherein a difference in height of the convexity/concavity of the insulating layer forming the optical path length adjusting section is set so that a color difference expressed by x-y coordinates $(\Delta x2+\Delta y2)^{1/2}$ with respect to a change in viewing angle of emitted light is smaller than 0.035.

* * * * *